(12) United States Patent
Dutta

(10) Patent No.: US 7,271,461 B2
(45) Date of Patent: Sep. 18, 2007

(54) STACKABLE OPTOELECTRONICS CHIP-TO-CHIP INTERCONNECTS AND METHOD OF MANUFACTURING

(75) Inventor: Achyut Kumar Dutta, Sunnyvale, CA (US)

(73) Assignee: Banpil Photonics, Sunnyvale, CA (US)

( * ) Notice: Subject to any disclaimer, the term of this patent is extended or adjusted under 35 U.S.C. 154(b) by 280 days.

(21) Appl. No.: 10/906,615

(22) Filed: Feb. 26, 2005

(65) Prior Publication Data

US 2005/0224946 A1 Oct. 13, 2005

Related U.S. Application Data

(60) Provisional application No. 60/521,153, filed on Feb. 27, 2004.

(51) Int. Cl.
*H01L 31/0232* (2006.01)
*H01L 29/18* (2006.01)
*H01L 33/00* (2006.01)
*H01L 27/15* (2006.01)

(52) U.S. Cl. .................. 257/432; 257/82; 257/84; 257/88; 257/98; 257/686; 257/E25.032

(58) Field of Classification Search ............... 257/82, 257/84, 432, 433, 98, 723
See application file for complete search history.

(56) References Cited

U.S. PATENT DOCUMENTS

| 5,198,684 A * | 3/1993 | Sudo ............................. 257/79 |
| 5,612,549 A * | 3/1997 | Nelson et al. ................. 257/88 |
| 6,052,498 A * | 4/2000 | Paniccia ....................... 385/14 |
| 6,434,308 B1 * | 8/2002 | Trezza .......................... 385/119 |

* cited by examiner

*Primary Examiner*—Nitin Parekh

(57) ABSTRACT

An optoelectronics chip-to-chip interconnects system is provided, including packaged chips to be connected on printed-circuit-board (PCB), multiple-packaged chip, optical-electrical(O-E) conversion means, waveguide-board, and PCB. Single to multiple chips interconnects can be possible using this technique. The packaged-chip includes semiconductor-die and its package based on the ball-grid array or chip-scale-package. The O-E board includes the optoelectronics components and multiple electrical contacts. The waveguide board includes electrical conductors transferring signal from O-E board to PCB and the flex optical waveguide easily stackable onto the PCB, to guide optical signal from one chip-to-other chip. The chip-to-chip interconnects system is pin-free and compatible with the PCB. The main advantages are that standard packaged-chip and conventional PCB technology can be used for low speed electrical signal connection. Also, the part of the heat from the packaged chip can be transmitted to PCB through conductors, so that complex cooling system can be avoided.

56 Claims, 33 Drawing Sheets

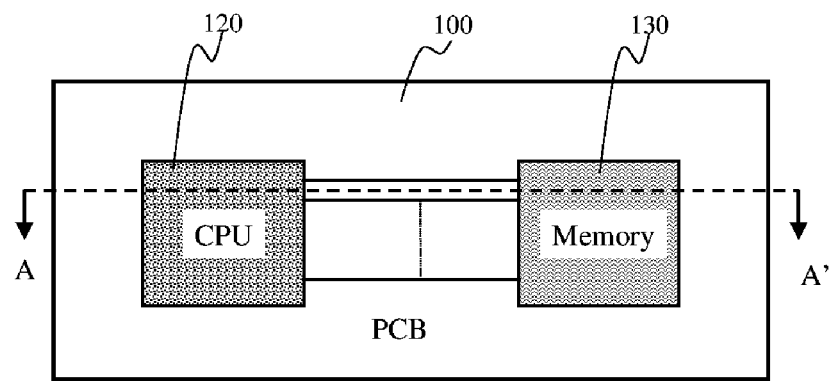
FIG.1A
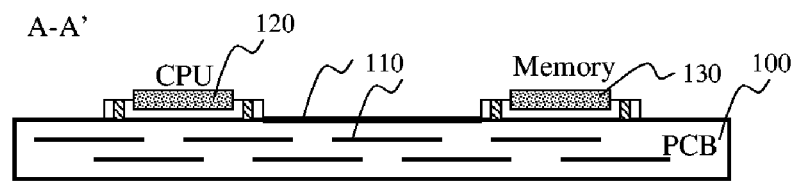
FIG.1B
FIG. 1
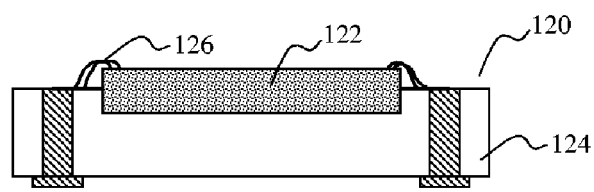
FIG.2A
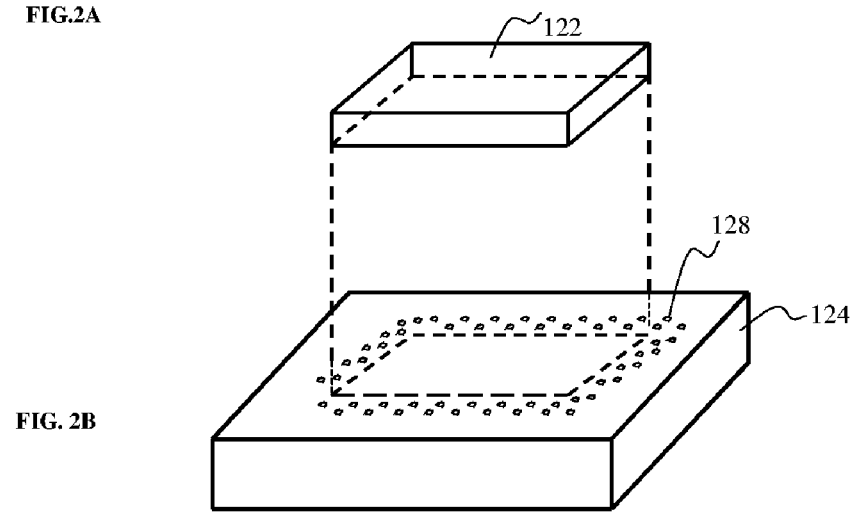
FIG. 2B
FIG. 2

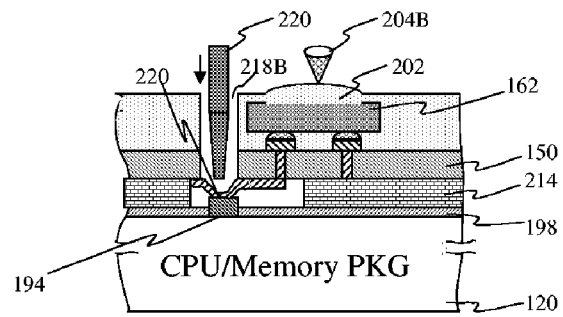
FIG. 16A
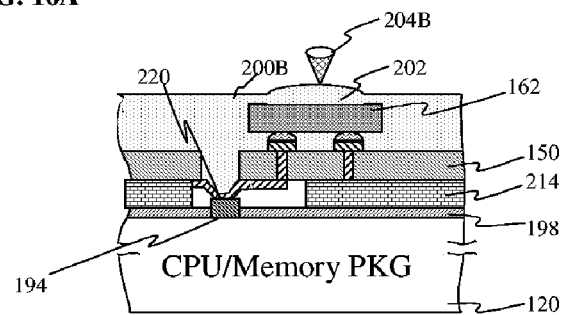
FIG. 16B
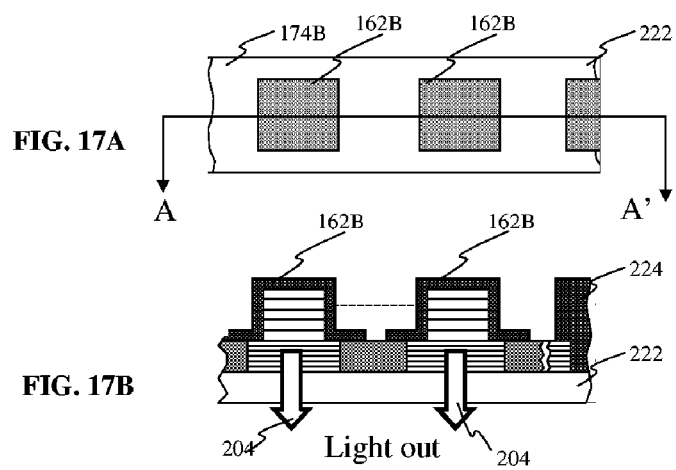
FIG. 17A
FIG. 17B
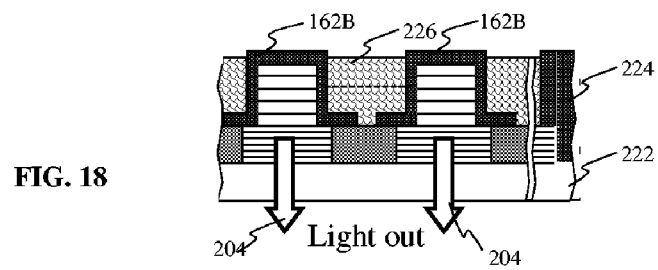
FIG. 18

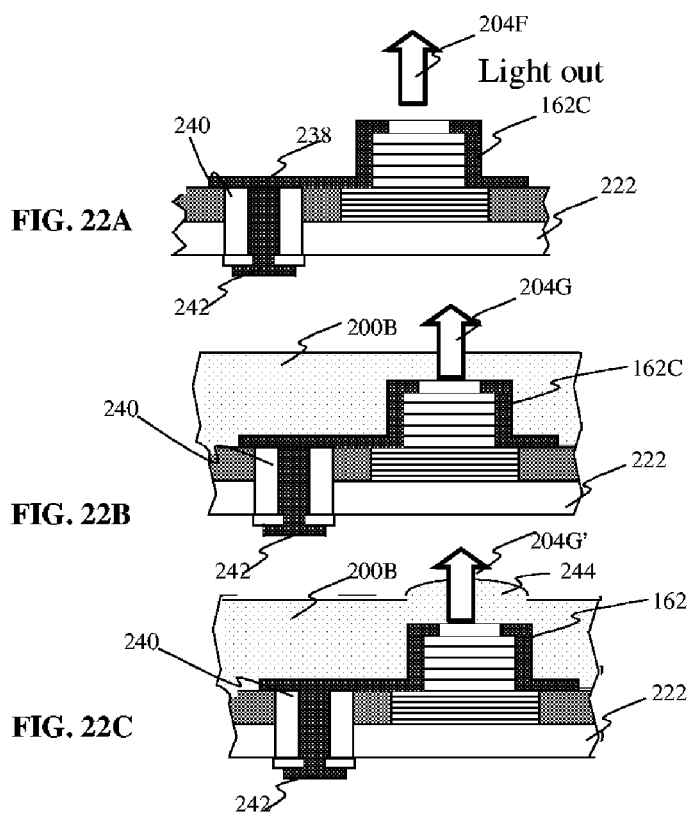
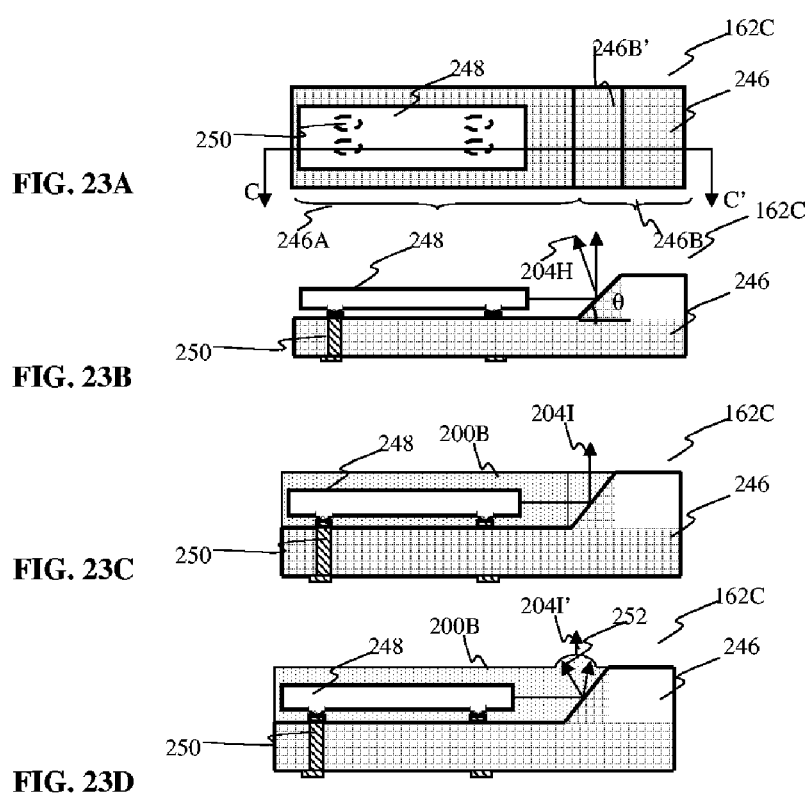

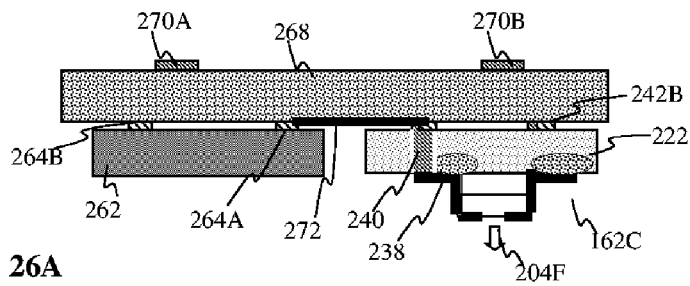
FIG. 26A
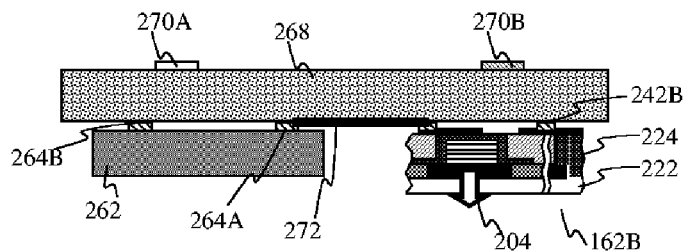
FIG. 26B
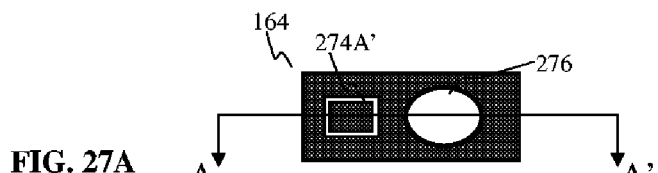
FIG. 27A
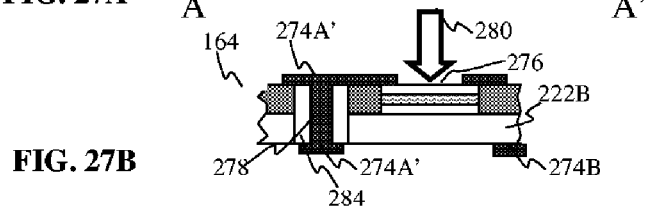
FIG. 27B
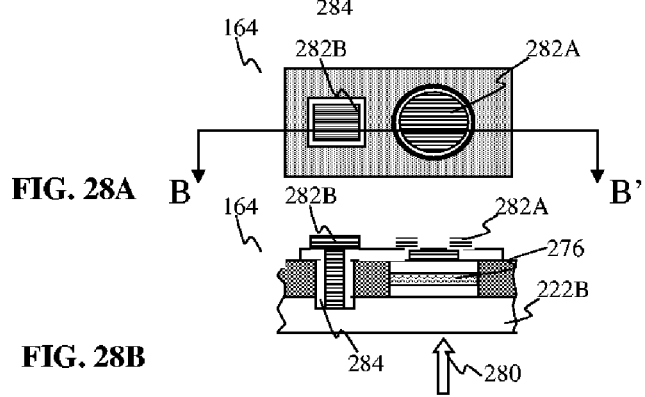
FIG. 28A
FIG. 28B

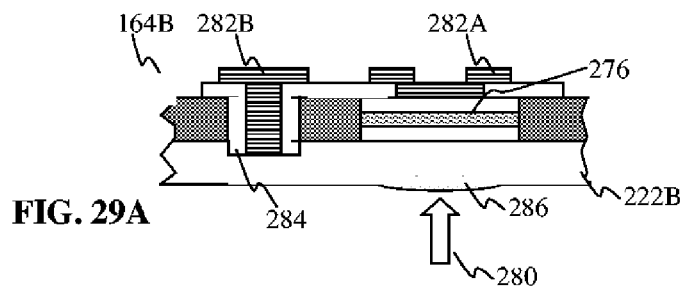
FIG. 29A
FIG. 29B
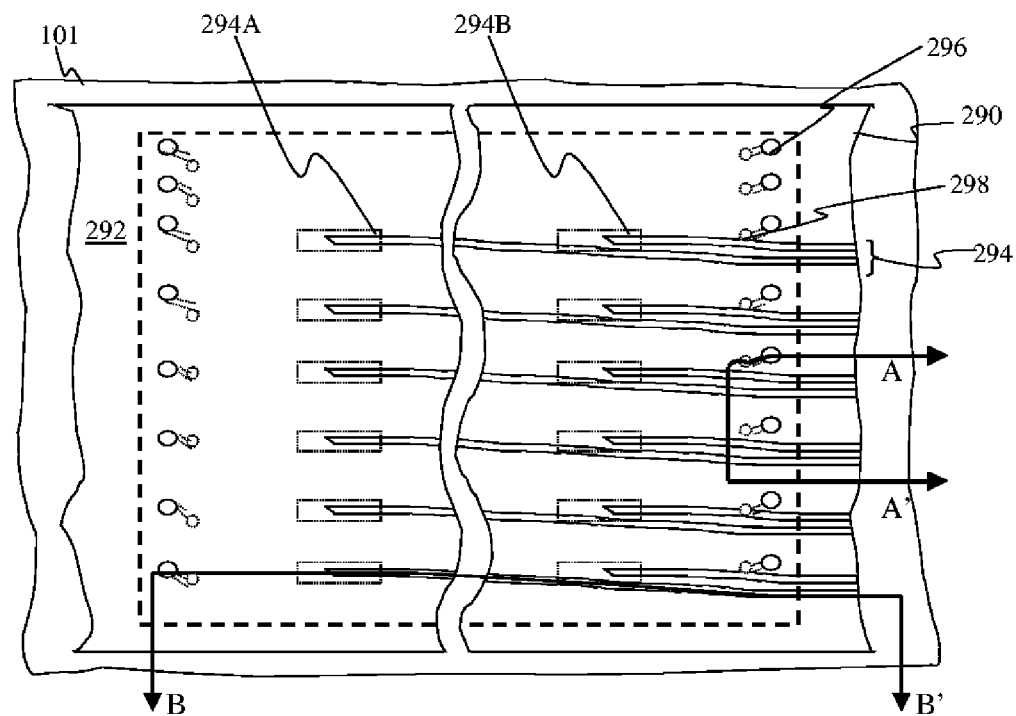
FIG. 30

↓ Core layer formation

↓ Patterning and etching for core formation

↓ Patterning, hole formation and metallization for contacts

↓ Patterning and mirror formation

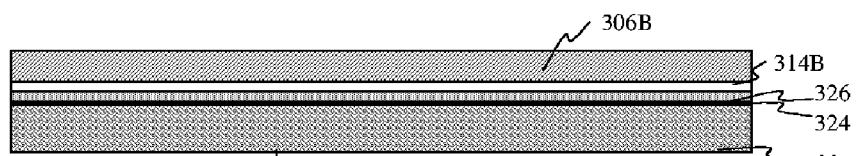
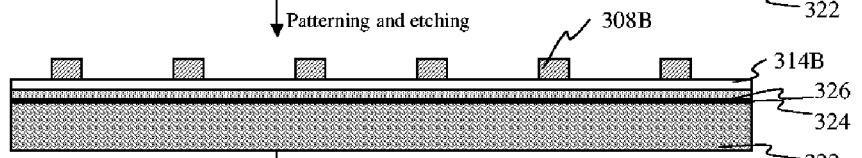
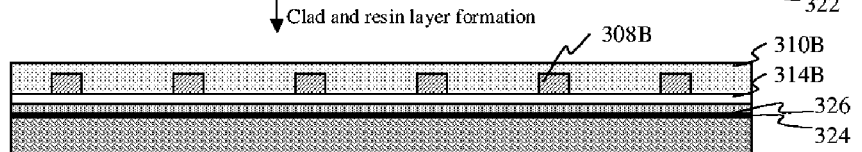
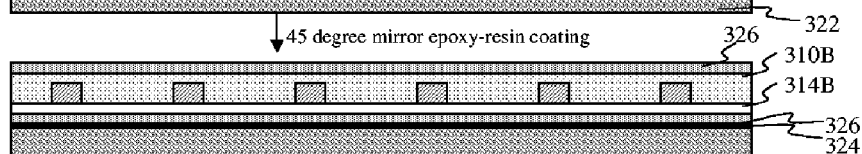
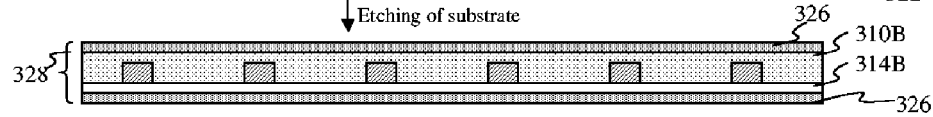
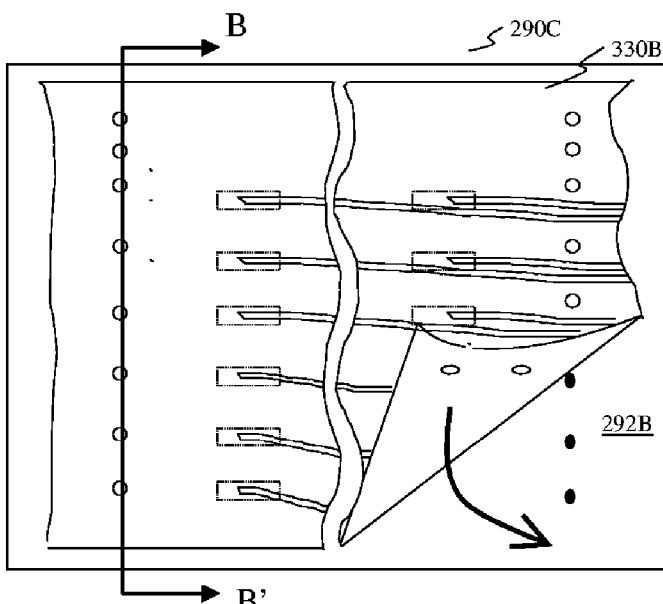
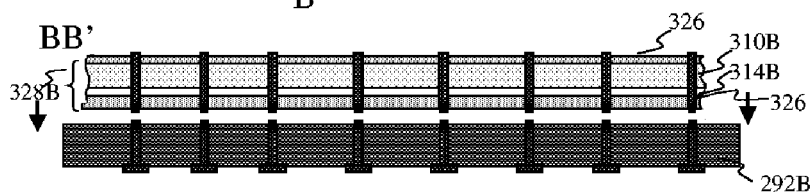

FIG. 42A
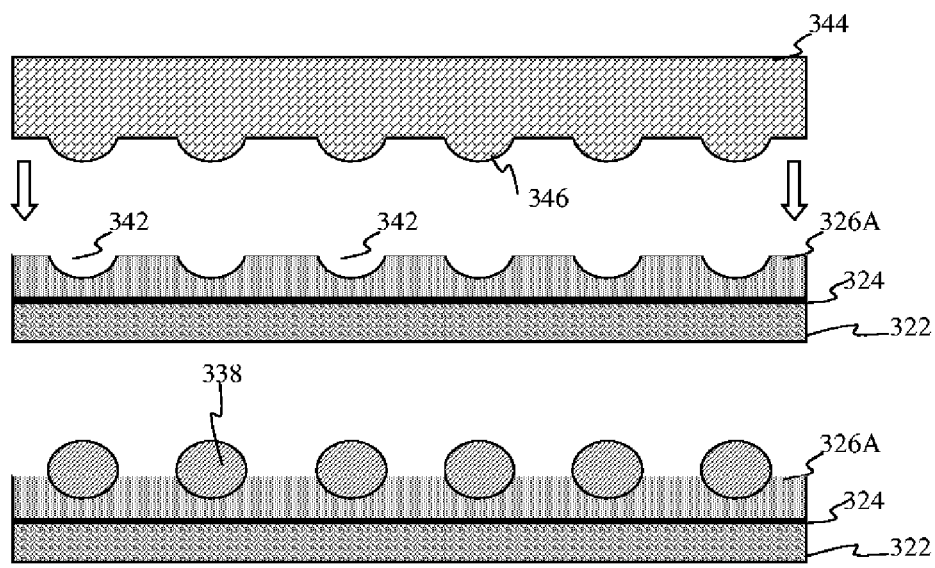
FIG. 42B
FIG. 43A
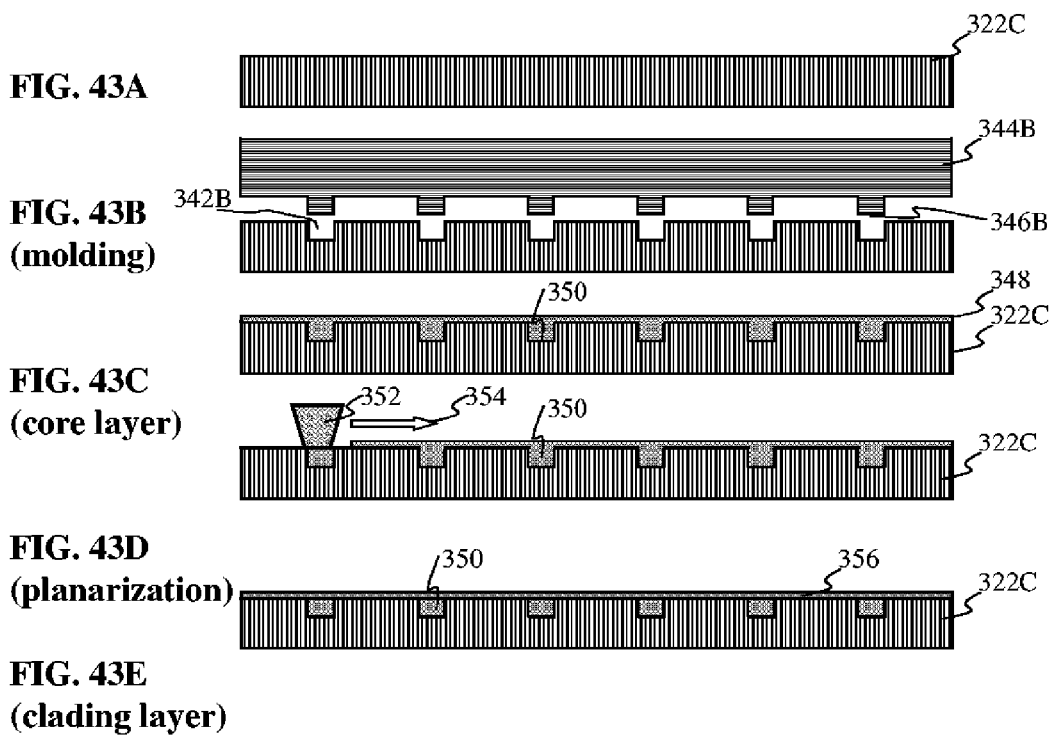
FIG. 43B
(molding)
FIG. 43C
(core layer)
FIG. 43D
(planarization)
FIG. 43E
(clading layer)

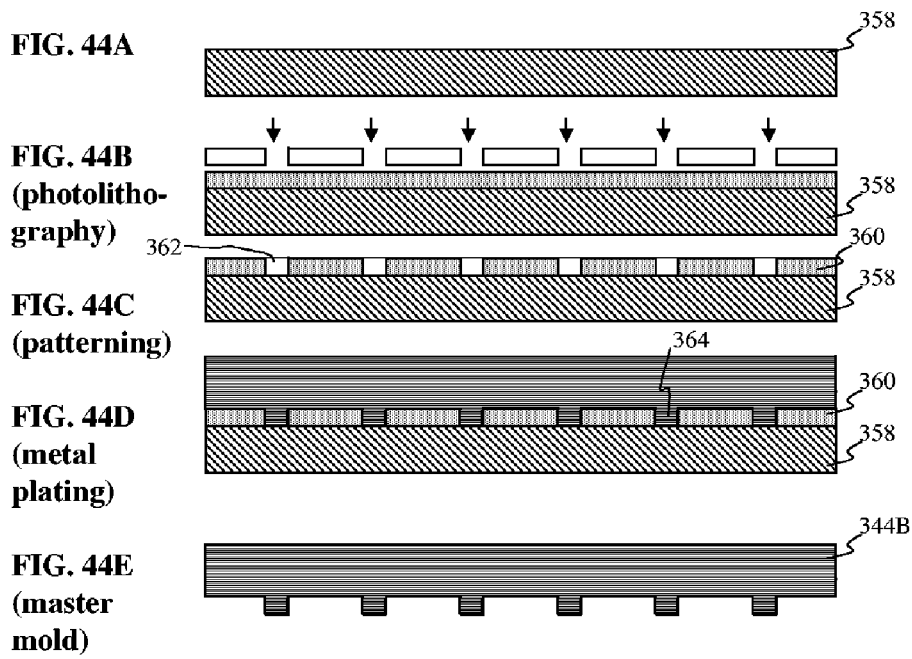
FIG. 44A
FIG. 44B (photolithography)
FIG. 44C (patterning)
FIG. 44D (metal plating)
FIG. 44E (master mold)
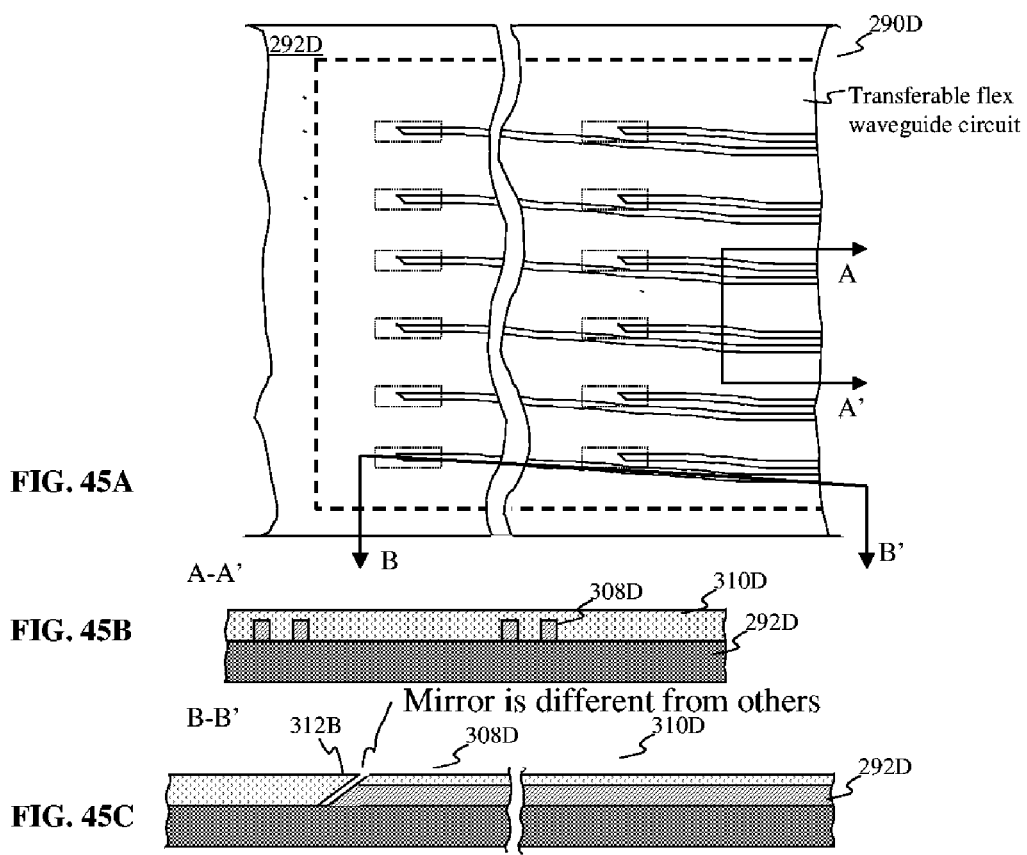
FIG. 45A
FIG. 45B
FIG. 45C

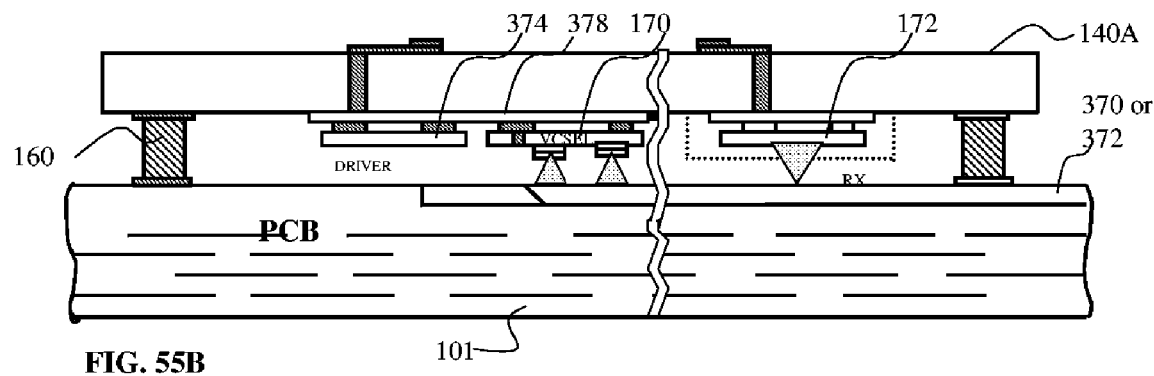
FIG. 55B
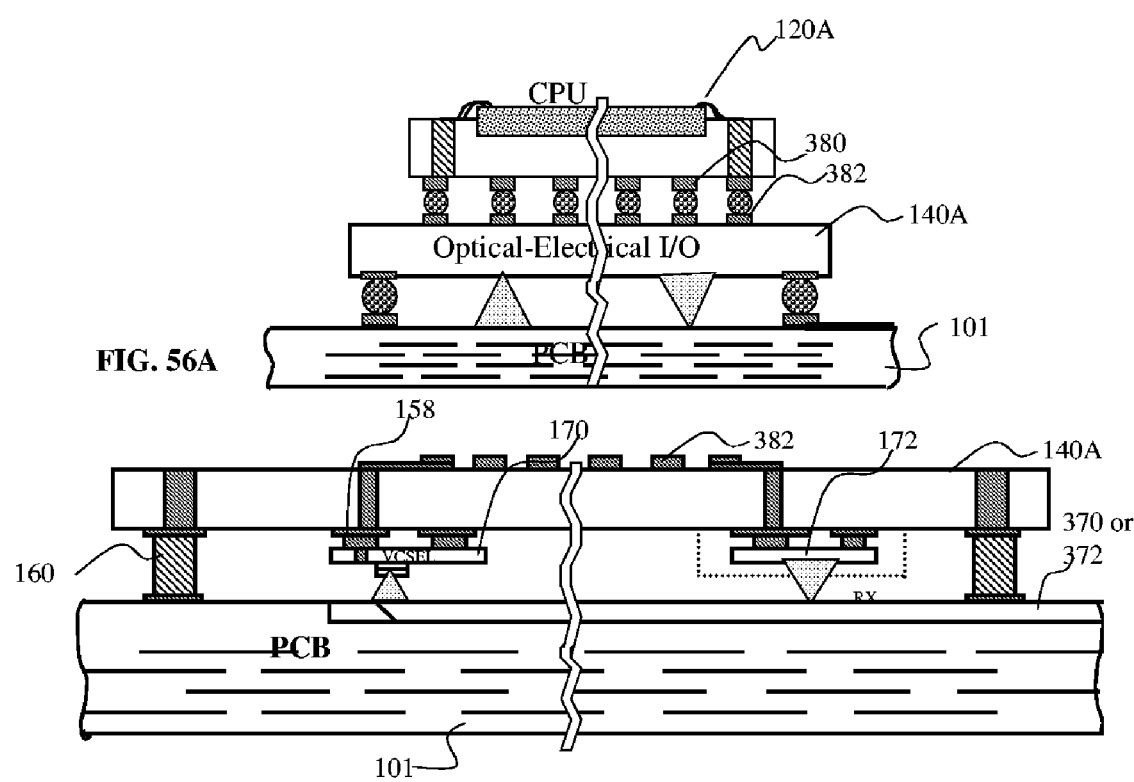
FIG. 56A
FIG. 56B

STACKABLE OPTOELECTRONICS CHIP-TO-CHIP INTERCONNECTS AND METHOD OF MANUFACTURING

CROSS REFERENCE TO RELATED APPLICATIONS

This application claims the benefits of U.S. Provisional Application No. 60/521,153 filed Feb. 27, 2004.

FIELD OF THE INVENTION

This invention relates to chip-to-chip interconnection, and more particularly to, connecting electrical signal line of single or multiple processor-chips to signal line of single or multiple memory chips, used in all kinds of computers covering from personnel computer to super-computer, and also in game system.

BACKGROUND OF THE INVENTION

The increasing of higher level of integration within electrical integrated circuit (IC) leads to both higher data rates and larger number of IC interconnections. Today, the inherent signal speed of IC is increased to 3 GHz, and shortly it will be reached to over 10 GHz. The number of pin connection is also increased, with single IC requiring close to 2000 interconnection (i.e. single processor), and shortly it will be increased to over 5000. Simultaneously achieving higher data rates and higher interconnect densities within the higher level of packaging, covering from die-level packaging to chip-to-chip (hereafter chip indicates the die with package) interconnection on the printed circuit board (PCB), will be increasingly difficult as the IC technologies continue to evolve increasing the signal speed and interconnection number.

With increasing of the signal speed and interconnection number within the IC, low-cost high-level packaging and related interconnection technology after post packaging are highly desirable to make available in consumer level. The packaging technology especially for single chip package (also mentioned as packaged-chip in the text) is improved to tackle the signal speed and pin connections. Ball grid array (BGA), chip scale package (CSP) etc. for IC package are developed accommodating required pin connections and the signal speeds, and it can accommodate the on-chip (inside the chip) speed. However, when it comes to the case of chip-to-chip (off-chip) connection on the PCB, the transition from thin film technology (which is IC and packaging technology) to the thick film technology of the PCB is a primarily dramatic transition. This is not only in terms of the technology but also in terms of interconnection density achievable on the single layer. With increasing of on-chip signal speed, the off-chip signal speed also increases. This off-chip electrical signal creates noises such as reflection caused by poor shapes of electrical interconnects, connecting the inter chip, or the influence of the cross-talk. In addition, the high-speed signal creates also high frequency electromagnetic waves from the electric interconnect to adversely affects the peripheral circuits. To reduce this reflection loss transmission line is to be properly designed with the proper characteristic impedance through out the inter-chip signal line with minimal discontinuities. To suppress the electromagnetic affect on the neighboring circuit, proper signal line and shielding in the PCB is to be designed. In the case of high speed off-chip interconnects especially over 3 GHz where line length is long, both reducing reflection loss and also suppressing electromagnetic interference are practically challenging in some extent, and are not cost-effective to implement by using of conventional PCB technology. Today's off-chip electrical interconnects are being implementing by lowering the signal speed at the level where conventional PCB technology is used and no such problems are occurred. In this case, the fully integration technology within IC in other words, the intra chip signal speed is not fully utilized.

FIG. 1 shows the schematic representing the conventional chip-to-chip interconnection on the conventional PCB 100. Here, chip 120 (for example processor) is connected with chip 130 (for example 3) by multilayered electrical signal lines 110 in the PCB 1. FIG. 2 shows the schematic representing the conventional BGA (ball grid array) and CSP (chip-scaled package) based packaging for high-speed single chip package (for example processor). In both type of packagings, die 122 and die 132 are attached with the ceramic or polymer substrate 124 and 134, respectively, containing the matrix of pins 126 and 136. Outside pins 128 and 138, located at the bottom-side of chip package (in both packaging cases) connect with the PCB, whereas topside of the package is connected with the heat sink to dissipate heat from the die. Both types of packages provide closer proximity of signal as on-chip. The fidelity of signal occurred due to the conventional electrical off-chip interconnections 110 through multiplayer PCB 100. It is highly desirable having the board-level electrical signal connection for high-speed off-chip connection, which could be compatible with existing IC package such as BGA, CSP etc., and also could be employed conventional PCB technologies.

To alleviate the problems such as cross talk, electromagnetic interference etc. usually occur in the high speed electrical interconnects, electrical signal lines in off-chip interconnects are partially replaced by the optical interconnects using the optical fiber or optical waveguide as the media. This is because the optical signal eliminates EMI problem and also reduces the generation of loss for even longer signal line interconnects. Many papers and patents applications (both international and US) disclose concerning optical interconnects in off-chip connection. One typical example is disclosed in Toshiyoshi et al., IEEE/OSA Journal of Lightwave Technology, Vol.17, No.1, pp.19-25(1999). In this report, chip-to-chip interconnection based on wavelength division multiplexing (WDM) technique is proposed. Free-space optical interconnection technique between IC chips are employed to transfer and receiving the optical signal using of micro-electro-mechanical system (MEMS) device. The proposed concept is similar to conventional WDM technique, frequently used in optical communication. This technique could increase the capacity per channel. However, if this technique is used in off-chip interconnections where chip-to-chip distance is few centimeters, this technique will be make the whole interconnection bulky, and could not be used in practical application where existing chip package and conventional PCB technology are frequently used.

This WDM technique may have no problem for use in the board-to-board interconnection where distances are few meters. However, in an application where existing chip with package such as BGA and CSP are used, the use of this free-space optic concept makes the interconnects more bulky, and miniaturization is difficult to achieve. Furthermore, free space optics concept is also not friendly to implement in the electronics systems such as desktop computer and video-gaming system, which are generally operated in dusty environment, and the deterioration of optical signal transmission/receiver may happen due to poor signal in long run system use. For the electronics system where miniaturization and the cost are the issues, it would be highly desirable to design the optical interconnects which could compatible existing chip package.

In conventional optical interconnects, where free-space optics techniques and/or Z-direction of the chip is used for transmitting the optical signal from transmitter to receiver, most of the time, cooling of the electronics chips are not being considered in most of the inventions, disclosed so far. With increasing of the on-chip speed, chip power consumption is also increasing. For the case of the electronics chip, dissipating large amount of heat, additional cooling system is necessary and conventionally, z-direction is used for cooling purpose. Today's optical interconnects where, chip's z-direction, is used for transmitting/receiving the optical signal, in such optical interconnects technique, cooling means can't be implemented and thereby, such optical interconnects are impractical for high speed off-chip interconnects.

U.S. Pat. No. 6,434,308 B1 (inventor: Trezza) discloses a connector system for the optical transceiver for interconnecting the chips through an array of emitters and detectors. In this connector system, the fiber bundles are used as a media to transmit and receive the optical signals for off-chip communication. In the disclosed patents, chip with package system aren't considered to make interconnects. The main drawbacks of this connector system is that additional interface board including packaging may necessary to make inerchip communication in chip with package level communication. Furthermore, this way of communication using of the fiber bundles prevents the system from miniaturization and not suitable for the electronics system, especially for off-chip communication. This connector system may suitable for the optical interconnects, especially board-to-board interconnects.

U.S. Pat. No. 6,411,418 B1 (inventors: Deri et al.) discloses architecture for multiprocessors interconnection using of WDM technique. Here, independent channels on different optical wavelengths are simultaneously broadcast to many nodes over a star coupler. No packaging scheme is described compatible for the chip package. This scheme may increase the bandwidth and latency and can't be applicable for the off-chip interconnects for the application like electronics system where chip with package level interconnects is concerned. Additional interface board including packaging scheme is necessary to implement this architecture.

As explained above, conventional electronics interconnect for off-chip communication has the drawbacks that integration technology of IC is not fully utilized, and also that exiting conventional electrical interconnects have the limitation of maintaining available on-chip signal speed. Today, the electrical interconnects among more than single chip are done at the speed limit where the cross talk, electromagnetic interference could be eliminated and this speed limit is below the speed available in on-chip level. With increasing on-chip signal speed, it is necessary to adopt interconnect technology which is compatible with today's chip-package and also could be easily implemented in the practical system.

Optical interconnects could eliminate the problems, that arises in high speed electrical off-chip interconnects. However, optical interconnects technology so far disclosed have also drawbacks that an interconnect system are not compatible with the chip (with package) level interconnects. For implementing the conventional optical interconnects into the practical application, whole chip-package technology is required to be developed or have different package technology compatible for the disclosed optical interconnects. Furthermore, the conventional interconnect technology is not friendly for manufacturing, which would be costly and far from the practical application. In addition, today's optical interconnects doesn't consider chip's cooling means. It is highly desirable to have an optical interconnects technique which is compatible to the today's chip-package and considers the chip cooling.

SUMMARY OF THE INVENTION

Accordingly, it is an object of the invention to provide an easily stackable/mountable optical interconnect system by which on-chip level signal speed can be maintained.

Another object of the present invention is to provide the optical-electrical board, which is compatible with available chip package and PCB technology.

Another object of the present invention is to provide the fabrication techniques of the O-E (optical-electrical conversion) board, which is compatible for the available chip package for the chip mounting.

Another object of the present invention is to provide the different interconnects method for mounting the O-E board onto the chip-package. This would help the users to both mechanically and electrically couple and decouple the chip package from the O-E board with relative ease.

Another object of the present invention is to provide the fabrication technique of the optical waveguide board stackable onto the PCB board.

Another object of the present invention is to provide the fabrication technique of the optical waveguide transferable onto the conventional PCB.

Another object of this present invention is to provide the high coupling efficiency waveguide board for increasing the tolerance in the assemblies and also to reduce the dispersion of the optical signal.

Another object of this present invention is to provide the type of optical devices and their fabrication techniques compatible for the O-E board.

According to the invention, stackable optical interconnect system for off-chip interconnects comprises:

a first chip with package; and a optical-electrical board for (interfacing electronics chip package to PCB,) input/output (I/O) signals from and to the electronic chip (hereafter mentioned as chip), optical guiding board, and the PCB to connect with the neighboring chip and circuit;

wherein the O-E board helps to connect the signal line and also power and ground of the IC package to the PCB board.

The invention offers to connect the signal line of one chip to other chip to communicate without sacrificing the signal speed available in onchip level. These inventions also use available chip package and the PCB technology, so that additional modification of chip package is not necessary to adapt this invention in practical application. The method and apparatus described in this disclosure enables to make the optical interconnects for off-chip interconnects in cost-effective manner and suitable for practical electronics system applications.

Another advantage of this invention is that conventional PCB technology with slight modification for optical waveguide implementation could be used.

In accordance with the invention, the O-E board is to be properly designed to covert optical-to-electrical and electrical-to-optical signals for transmitting and receiving signals required for off-chip communication. The O-E board for I/O signals could be fabricated on the rigid substrate or on the flex-substrate using polymer materials. The emitter and detectors required for converting electrical-to-optical and optical-to-electrical signals are hybridly fabricated onto the O-E board. The optical signals (from and to the O-E board) are based on the free-space optics. In order to reduce the dispersion of the signals and easiness in the assembly for cost-effective board fabrication, pre-positioned micro-mirror, or micro grating are used onto the waveguide, which can increase the tolerance in the assembly. Stacking of the O-E board and the chip could be done using flip-chip bonding or based on the pin connection. As the optical signal is taken out from the bottom, the output electrical connections are power and ground which could taken out through O-E board, and the foot-print could be the same as the chip.

In accordance with the invention, the electrical contacts are designed to efficient heat dissipation from chip-package to PCB, which help to replace the complex cooler being used in today's chip (for example processor) cooling. The electrical contacts are arranged in such a way that the contacts for grounding is arranged in the peripheral outline which at the same time acted as the tunnel for the heat dissipation from the chip to PCB. Alternatively, the wider electrodes targeting for the heat dissipation can be designed.

Other object of this invention is to minimize the skew in the signal interconnection, occurred due to the signal delay, by transforming the high-speed signal into the optical signal.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein, FIGS. 1A and 1B are top and cross-sectional views showing prior art electrical interconnects for inter-chip connection;

FIGS. 2A and 2B are top and cross-sectional views showings BGA based chip package for high-speed die package. This is an explanatory diagram showing chip package as mentioned in FIGS. 1A, 1B and other FIGS. in this invention;

FIGS. 16A, and 16B are the enlarged schematic cross-sectional view equivalent to FIG. 8 of an alternate embodiment for interconnecting the chip package and O-E board;

FIGS. 17A and 17B are the enlarged top and schematic cross-sectional views taken along A-A' direction in accordance with this invention;

FIG. 18 is the enlarged cross-sectional view equivalent to FIG. 17B of an alternate embodiment according to this present invention;

FIGS. 22A, 22B and 22C are the enlarged cross-sectional view of the top emitting VCSELs in the preferred embodiments according to this present invention;

FIGS. 23A, 23B, 23C, and 23D are the enlarged cross-sectional view of the edge emitting light source and the means making the beam as top emitting equivalent the VCSELS of alternate embodiments according to this present invention;

FIGS. 26A, and 26B are the enlarged cross-sectional view of the connection schemes of the VCSELS and drivers to the common carrier in the preferred embodiment according to this present invention;

FIGS. 27A and 27B are the enlarged cross-sectional view of the top incidence photodetector in the preferred embodiment according to this present invention;

FIGS. 28A and 28B are the enlarged cross-sectional view of the bottom incidence photodetector in the preferred embodiment according to this present invention;

FIGS. 29A and 29B are the enlarged cross-sectional view of the bottom incidence photodetectors in the preferred embodiment according to this present invention;

FIG. 30 is a plan top view of waveguide board constructed in accordance with the invention;

FIGS. 37A, 37B, 37C, 37D, and 37E are the enlarged cross-sectional view of the waveguide-board fabrication processes, taken across AA' directions of FIG. 30, in the preferred embodiemnt according to this present invention;

FIGS. 39A and 39B are a plan top view and the enlarged cross-sectional views of waveguide, taken across BB' direction in FIG. 39A, constructed in accordance with the invention;

FIGS. 42A and 42B are the enlarged cross-sectional view of the master mold fabrication process in the preferred embodiemnt according to this present invention;

FIGS. 43A, 43B, 43C, 43D, and 43E are the enlarged cross-sectional view of the waveguide-board fabrication processes, equivalent to FIG. 40 of an alternate embodiment, constructed in accordance with the invention;

FIGS. 44A, 44B, 44C, 44D, and 44E are the enlarged cross-sectional view of the master mold fabrication process, equivalent to FIG. 42 of an alternate embodiment according to this present invention;

FIGS. 45A, 45B, and 45C, are a plan top view and the enlarged cross-sectional views of waveguide, taken across and AA' and BB' directions, in FIG. 45A, constructed in accordance with the invention;

FIGS. 55A and 55B are the enlarged cross-sectional views of an O-E board containing the optical components and driver, and with underlying PCB board, equivalent to FIG. 54 of an alternate embodiment interconnect accordance with the present invention;

FIGS. 56A, 56B, and 56C are the enlarged cross-sectional views of a CSP based chip-packaged, an O-E board containing the optical components, and with underlying PCB board, equivalent to FIG. 54 of the alternate embodiment interconnects accordance with the present invention;

DESCRIPTION OF THE PREFERRED EMBODIMENTS

Figures 3, 3A, 3B:
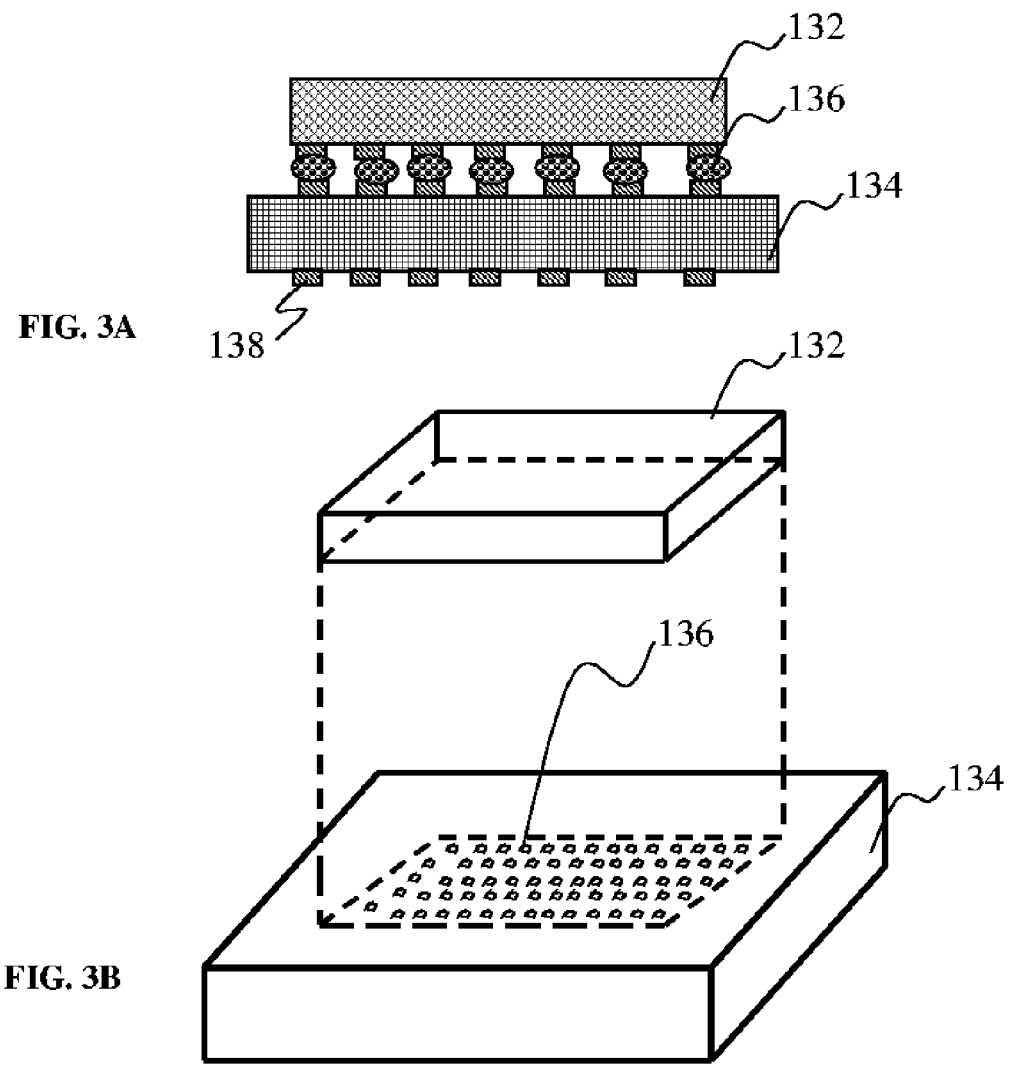
FIGS. 3A and 3B are top and cross-sectional views showings CSP based chip package for high-speed die package. This is an explanatory diagram showing chip package as mentioned in FIGS. 1A, 1B and other FIGS. in this invention.

Four best modes for carrying out the present invention will be described in turn with reference to the accompanying drawings. In the following description, the same reference numerals denote components having substantially the same functions and arrangements, and duplicate explanation will be made only where necessary.

An important point of optical interconnects system for high speed off-chip connection according to the first embodiment is the idea that essential part, an optical-electrical (hereafter mentioned as "O-E") board is required and it is to be compatible and easily stackable with the available chip package and also PCB. To make the cost-effective, the board should be friendly for the manufacturing as the electronics components.

In off-chip interconnection, the signal between the chips may be conveyed electrically through the wire or optically through the optical media. Especially, the idea is to transfer the high-speed signal from one chip to another after conversion into optical from electrical and vice-versa for the receiving signal. The low speed signal connection and the rest of the others connection such as ground and power line connections are done through the electrical wire. When the signals are conveyed by light (i.e. optically), the optoelectronics devices provide the conversions between the light and electrical representations of the signals.

Figure 4:
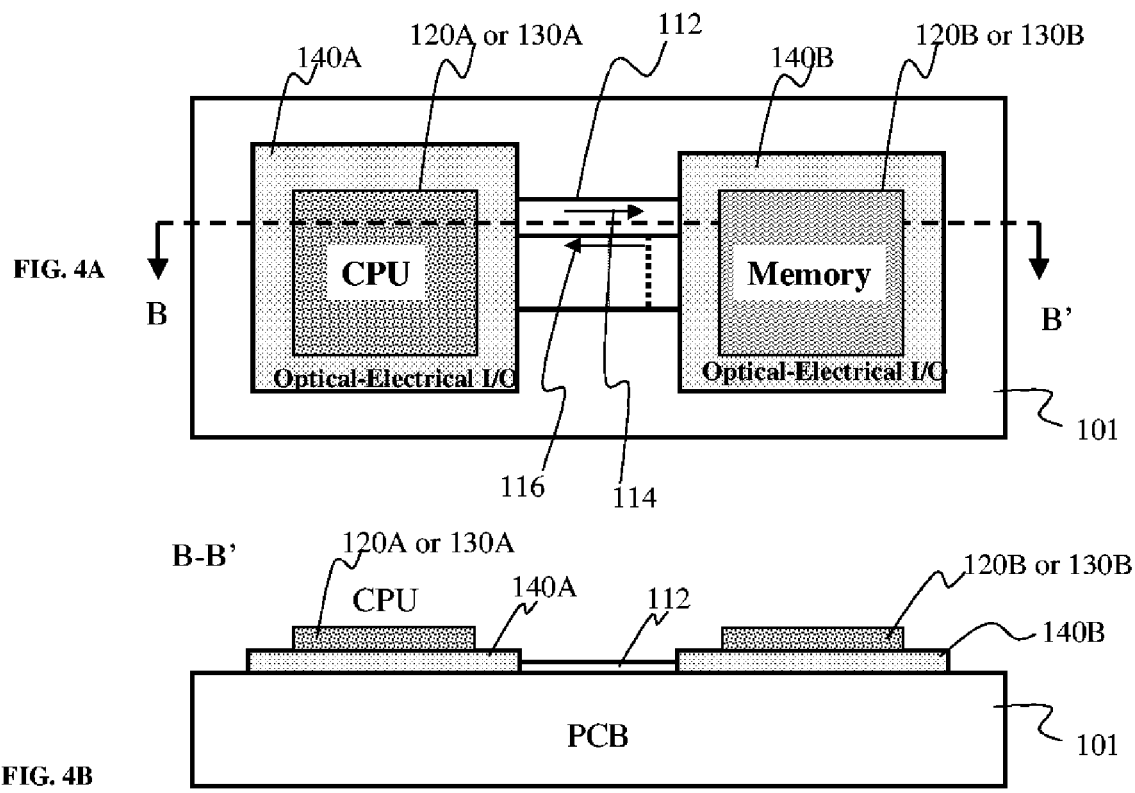
FIGS. 4A and 4B are simplified top and cross-sectional views taken along B-B' section, illustrating the inter-chip connection employing the optical interconnects in a first preferred embodiment according to the invention.

FIG. 4A is the schematics showing the top view of optical interconnects system for off-chip interconnects in accordance with the invention. FIG. 4B is a cross-sectional view taken along a direction B-B in FIG. 4A. The chip 120A (or 130A) communicates with chip 120B (or 130B) by optically.

As shown in FIGS. 4A and 4B, the optical-electrical board 140 has a structure in which chip 120A (or 130A) is stacked or mounted on a PCB 101. The chip 120A (or 130A) can communicate with chip 120B (or 130B) through the optical connects of 112. The high speed electrical signals of the chip 120A (or 130A ref. FIG. 3) and 120B (or 130B) are converted into optical signals by the O-E boards 140A and 140B, respectively, located in each side of the chip. The high-speed optical signals 114 and 116 can transmit to and receive from other chip through array of optical waveguide 112.

First, the arrangement of this optical-electrical printed board 140 (or 150) will be explained with reference to FIGS. 4A and 4B, in the order of different O-E board structures based on the chip packages, fabrication, and connecting means for electrically connecting the chips. For the sake of simplicity, one side of the chip (for example 140A) is only considered. Similar interconnects could be expected for the case of O-E board of counterpart chip.

Figure 5:
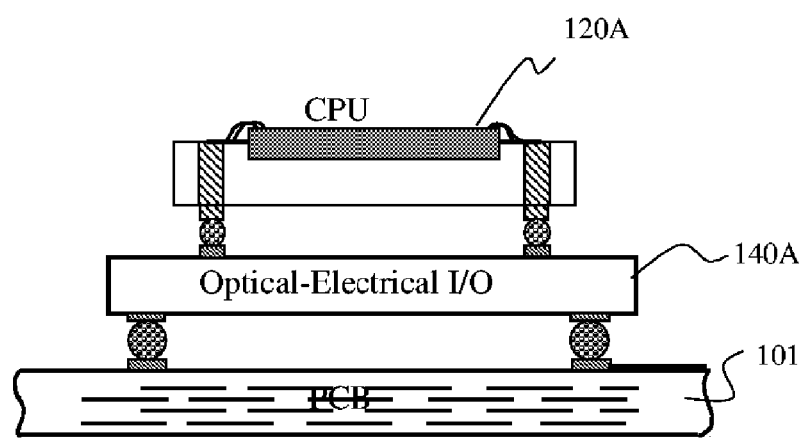
FIG. 5 is a simplified cross-sectional view of the structure including the chip-package, O-E board, and underlying PCB according to the present invention.

FIG. 5 is the simplified cross-sectional view of the structure including the chip-package 120A, O-E board 140A, and underlying PCB 101A according to the present invention. For simplicity in the explanation, one side of the chip is considered, similar interconnects could be assumed for counterpart chip. Chip package using of BGA or fine BGA is considered.

Figure 6:
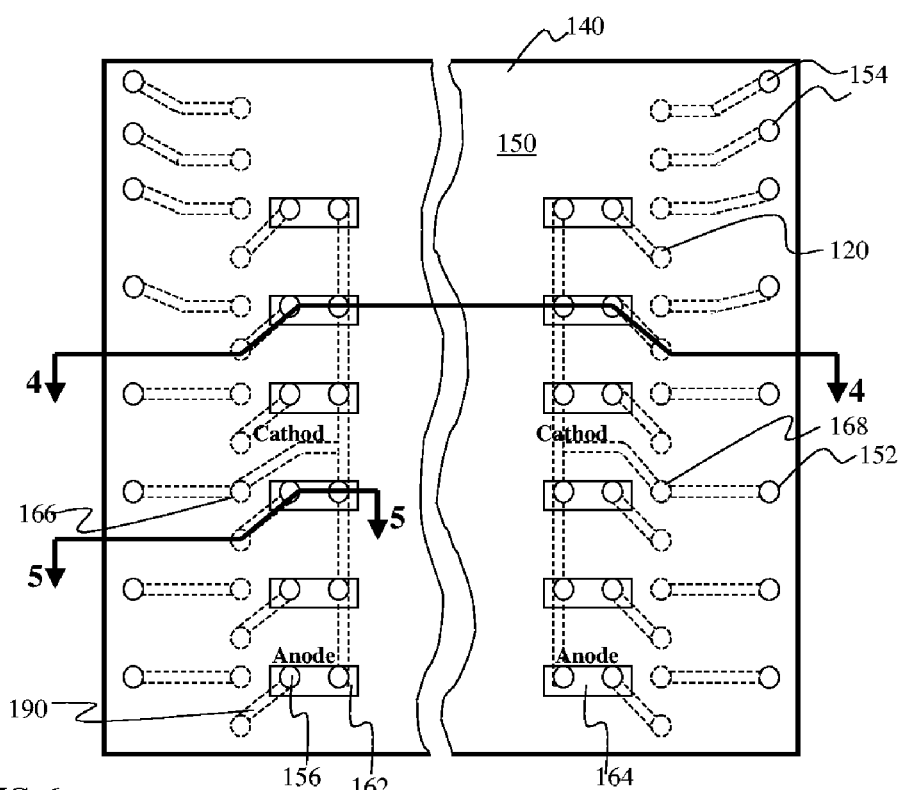
FIG. 6 is a plan bottom view of O-E board for BGA package constructed in accordance with the invention.

FIG. 6 is a plan view, showing from the optical part mounting side (bottom), the O-E board 140 according to the second embodiment. The O-E board 140 for interconnects is included a singulated chip (with package) 120 and a singulated portion of the circuit 152. The O-E board 140 and the circuit 152 have peripheral outline substantially similar to that of the package 120. The circuit 152 includes a substrate 150, which comprises with insulating, flexible material or rigid material. The flexible material could be any kinds of polymer material, which includes polyimide, polyester, epoxy, urethane, polystyrene, silicon or polycarbonate. The substrate 152 also includes the rigid substrate. Suitable materials for the rigid substrate cover ceramic materials including aluminum nitride, aluminum oxide, and boron nitride. The material having high thermal conductivity and high dielectric constant also covers this substrate material. The thickness for the substrate 152 can be 20 to 500 um.

The circuit 152 of the O-E printed board also includes an array of external contacts 154 and 156 formed on a first side of the substrate 150. The external contacts 154 are for the electrical contacts especially for the power and ground connects to the PCB 101, and whereas the external contacts 156 are for the contacts for the optical components connects. In the illustrative embodiment (FIG. 8) the external contacts 154 and 156 are metal balls on the metal plat 158 and 160. Each external contact 154 and 156 can be hemispherical, convex or dome shaped with the diameter "D" and height "H". The diameter and height can be vary from 25 μm to 1 mm. Especially for the contacts 156 which are in contact with the optical components, "D" and "H" are to be selected in a way that the inductance and capacitance induced due to the contact don't have an affect on the converted O-E signals. The pitch and the density of the contacts 154 and 156 can be selected as required. The external contacts 154 and 156 can be arranged in dense array in the form of BGA or fine BGA. For simplicity in FIG. 6, the external contacts 154 and 156 are illustrated in an array of two rows. However, some dense arrays can cover the entire face of the chip package 120 and hundreds (and thousands) of external contacts 154 and 156.

Figure 8:
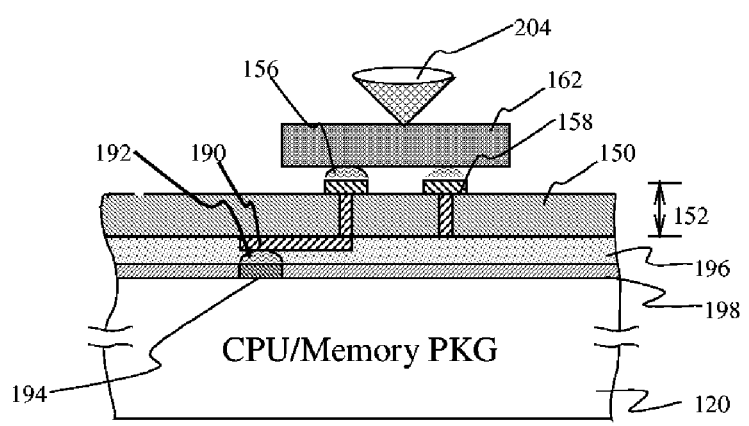
FIG. 8 is an enlarged cross-sectional view of an O-E board taken along section line 5-5 of FIG. 6 illustrating an interconnect structure for the package in FIG. 6 for the preferred embodiment in accordance with the present invention.

The external contacts 154 and 156 can comprise a solder alloy which includes 80Au: 20Ge, 80Au: 20Sn, 10Au: 90Sn, 94Au: 6Si, 25Sn: 75Pb, 30Sn: 70Pb, 40Sn: 60Pb, 50Sn: 50Pb, 63Sn: 37Pb. Especially, the contacts 156, which connect with optical devices, can have the alloy with higher melting point. The external contacts 154 and also 156 can comprise the pre-fabricated solder balls bonded to solder wettable land pads 158 and 160 (ref. FIG. 8). Alternately, the contacts 154 and 156 can be formed using electro-plating deposition or electro less deposition process to deposit pads and balls of desired materials. Again, alternately, the contacts 154 and 156 can comprise a conductive polymer material such as metal filled epoxy bumps formed by a stencil process.

The number of discrete optical components, for examples emitters 162 and photodetectors 164 are bonded on the contacts 156, to convert the high speed electrical signals into optical signals and vice versa. Solder alloy as mentioned before can be used for bonding the optical components onto the substrate 150. Picked and placed technique frequently used IC manufacturing can be used. The position of the optical components can be determined by alignment marker (not shown) formed on a substrate 150. The contacts 156 are designed in a way that single contacts 166 and 168 of 156 can be used for common cathode connection for the emitters 162 and for the photodetectors 164, respectively.

Figure 7A:
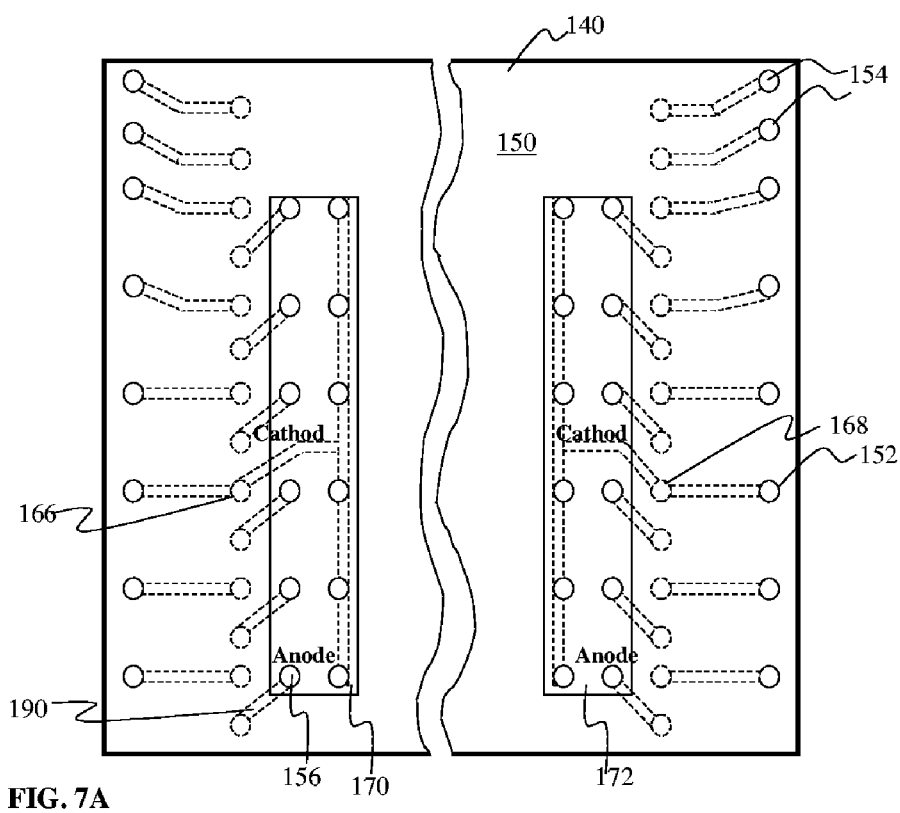
FIGS. 7A and 7B are a plan bottom view of O-E board for BGA package constructed for the array of emitters (or detectors) fabricated on the same wafer in accordance with the invention.

Alternately, the array of emitters 170 and photodetecors 172 having anode-cathode pair, fabricated on single wafer can also be used in the O-E printed board 140, as shown in FIG. 7A. Alternately, the array of emitters 174 and array of photodetectors 176 having a common cathode 178 and 180 for both emitters and photodetectors respectively can also be used in the O-E board 140.

Figure 7B:
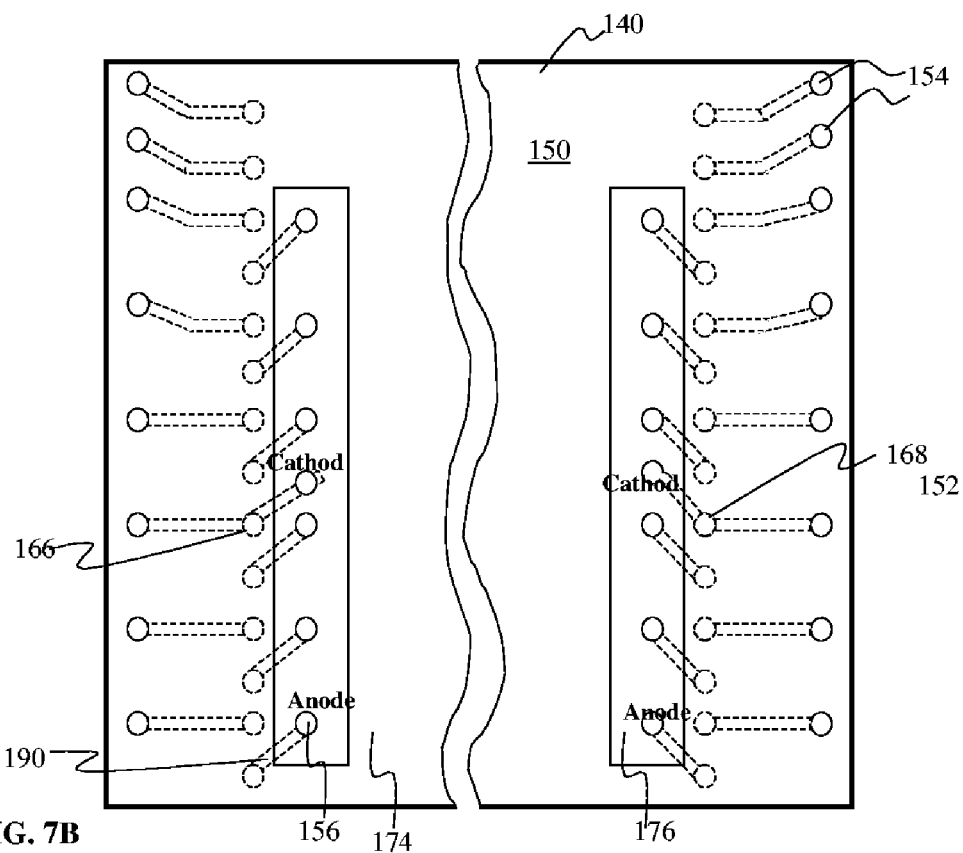

As shown in FIGS. 6, 7A, and 7B, the circuit 152 of the O-E printed board 140 also includes a pattern of conductors 190 formed on second side of the substrate 150 of the O-E board 140 for electrical communication of the external contacts 154 and 156. The second side is connected with the chip side. The conductors 190 can be formed onto the substrate prior to the formation of the contacts 154 and 156 to connect. The conductor's patterns 190 can be formed as follows: First, metal layer is deposited on the substrate 150 using of sputtering, or evaporation. The patterning and etching to form the conductor patterns 190 follow this. Highly conductive metal such as gold, plated gold, copper, plated copper, Ni or Ni-based alloy is preferable for the conductors 190. The thickness of the metal varies from 1 μm to 50 μm. Instead of using the deposited metal, the electroplating deposited metal can be used for forming the conductor's patterns 190. The length of the conductor patterns 190 on the substrate 150 varies from few um to few mm. For longer pattern length, the conductor pattern 190 could be micro-strip line or coplanar line to be designed based on the signal speed.

FIG. 8 is an enlarged cross-sectional view of the O-E printed board taken across 5-5 section of FIG. 6 in the preferred embodiment according to the present invention, wherein like parts are indicated by like reference numerals as used in FIGS. 6 and 7, so that repeated explanation is omitted here. In FIG. 8, the electrical interconnect between O-E printed board 140 and the chip package 120 comprise the conductors pattern 190 which connect with the solder bumps 192 on the chip package contacts 194 through the conductive polymer layer 196 in between O-E board and the chip package. This technique offers high tolerance, which makes easiness in the mounting the chip onto the O-E board.

Suitable material for conductive materials includes Z-axis anisotropic adhesive and Z-axis epoxies. The Z-axis conductive anisotropic adhesive provides electrical conductivities along Z-axis, while providing isolation along x-axis. Using of conductive polymer layer 196, makes electrical connection is made between the solder bumps 192 on chip with the conductor pattern 190. Based on the signal speed the thickness of the conductive polymer layer 196 is to be selected, and it is from 2 μm to 500 μm. Insulation layer 198 is used to electrically isolate the chip contacts with the other contacts. The solder bumps 192 on the chip contacts 194 comprise with the solder alloy as described above, or can be electro-plating deposited using the process as described in the U.S. patent application Ser. No. 08/905,870, mentioned herewith for reference only. The melting point is lower than the solder alloy used for bonding the optical components on the O-E board 140. The material type can be selected as required.

Figure 9:
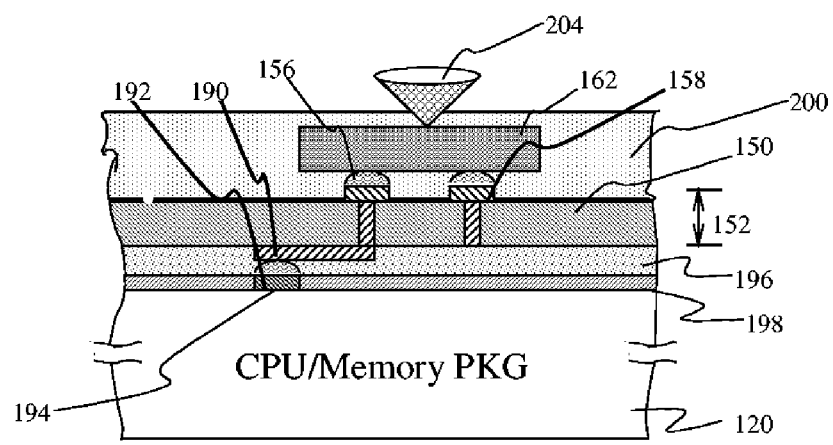
FIG. 9 is an enlarged schematic cross-sectional view equivalent to FIG. 8 of an alternate embodiment interconnects.

FIG. 9 is an enlarged cross-sectional view of the O-E printed board taken across 5-5 section of FIG. 6 in the preferred embodiment according to the present invention, wherein like parts are indicated by like reference numerals as used in FIGS. 6, 7 and 8, so that repeated explanation is omitted here. Here, additional polymide resin layer 200 is used on the top of the optical components. This polymide layer protects the optical components from damage. The refractive index of the polymide layer is >1.55 and it can be selected suited for the wavelength of the optical signal transmitted through the layer. Suitable polymide materials include the epoxy resin, fluorinated polymide-based resin or fluorinated epoxy based resin. The polymide can be formed by spin coating, which is followed by curing at temperature below 50 C to 350 C, or by ultra violet curing.

Figure 10:
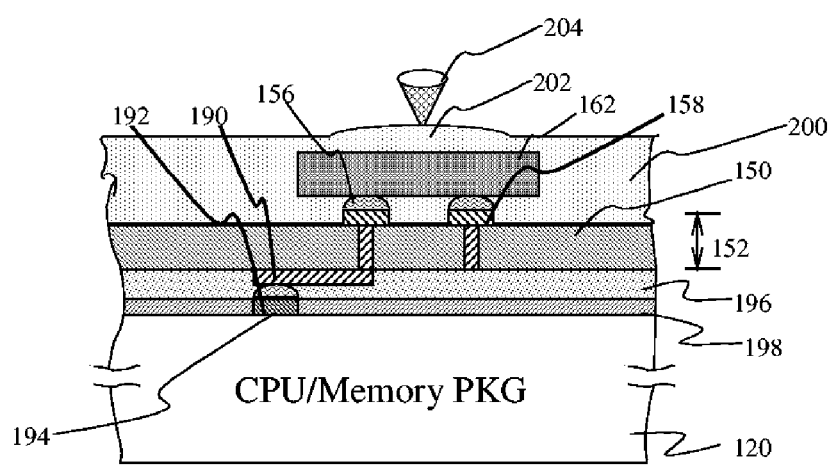
FIG. 10 is an enlarged schematic cross-sectional view equivalent to FIG. 8 of an alternate embodiment interconnects.

FIG. 10 is an enlarged sectional view of the O-E printed board equivalent to FIG. 9 in the preferred embodiment according to the present invention, wherein like parts are indicated by like reference numerals as used in FIGS. 8 and 9, so that repeated explanation is omitted here. Here, the integrated microlens is formed onto the polymide layer 200. This is either to focus or to collimate the beam 204 so that high efficiency waveguide coupling is possible without using of any additional optics in between. The tolerance in the assembly is also achieved using this. The microlens can also have a compound lens structure to achieve a better-optimized beam profile. The microlens can be made using the standard microlens fabrication techniques such as resist reflow (refractive lens) and dry etching (diffractive lens). Reflow resist such as AZ4620 can be used as the lens material. Alternately, the molded plastic lens 202 with required focal length can also be used onto the top of the polymide layer 200. Suitable material for the lens can be the same material as polymide layer 200, or different polymer materials such as polymethyl methacrylate (PMMA), Styrene, butadiene, butadiene and styrene based polymer (e.g. acrylonitride-butadiene-styrene (ABS)) resins, polycarbonate, and acryl. To increase the mechanical strength, butadiene based rubber-reinforced resin, as noted in U.S. Pat. No. 6,448,342 (Inventors: Takahashi et al.). The refractive index of polymer material used here as molded plastic lens or reflowed resist have the refractive index >1.55, and can be selected closer to the underlying layer 200. Same material can be used for both layer 200 and the lens material, and the process can be done one time.

Figure 11A:
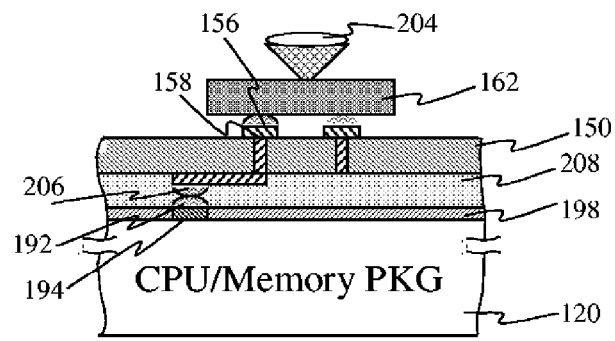
FIGS. 11A, 11B, and 11C are the enlarged schematic cross-sectional view equivalent to FIGS. 8, 9 and 10 of an alternate embodiment for interconnecting the chip package and O-E board.
Figure 11B:
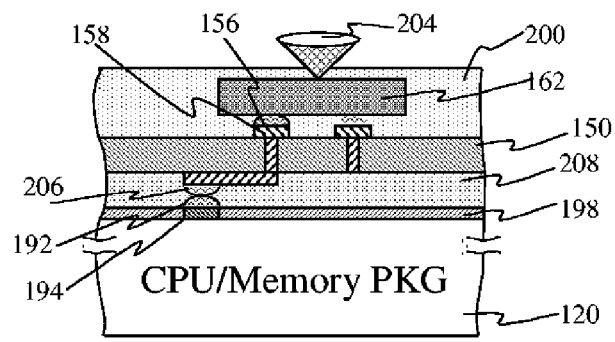
Figure 11C:
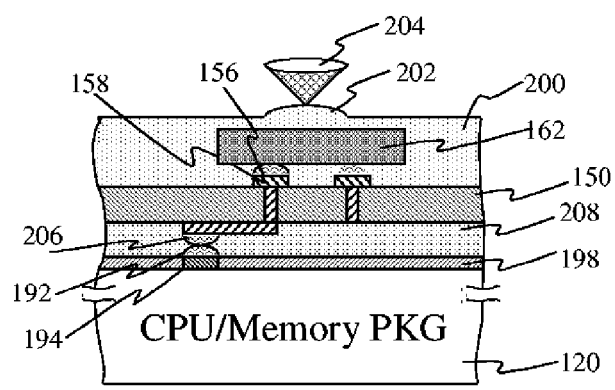

FIGS. 11A, 11B and 11C are the enlarged sectional view of the O-E printed boards equivalent to FIGS. 8, 9, and 10 in the preferred embodiment according to the present invention, wherein like parts are indicated by like reference numerals as used in FIGS. 8 9, and 10, so that repeated explanation is omitted here. The solder bumps 206 on O-E printed circuit conductors 190, and 192 on packaged-chip contact 194 are used to electrical connects. Suitable materials for solder materials are previously mentioned, and the melting points are lower than those used in bonding the optical components on the O-E printed circuit. Conductive polymer bumps can also be used in this case, and suitable material includes anisotropic adhesive or isotropic adhesive as mentioned previously. Polymer bumps can be formed by dot shooting through nozzle, and can be formed in a half-cured and fully cured after making the making the contacts. Full curing can be done either by UV irradiation or temperature treatment. Electrically insulating adhesive layer 208 is used in between the packaged-chip and the O-E board 140. The material for insulating layer 208 can be chosen to act not only for electrically insulating, but also for the physically attaché the O-E board 140 onto the chip-package 120. Curable either by UV irradiation or temperature treatment, adhesive can be chosen for this layer 208 formation. Suitable materials for insulating adhesive layer include, but not limited to, cyanoacrylate adhesives (commercialized by Loctite Corp, Rocky Hill, N.J.) and also silicon elastomer such as ZYMET (manufactured by ZYMET, East hanoover, N.J.) can be used for this purpose.

Figure 12A:
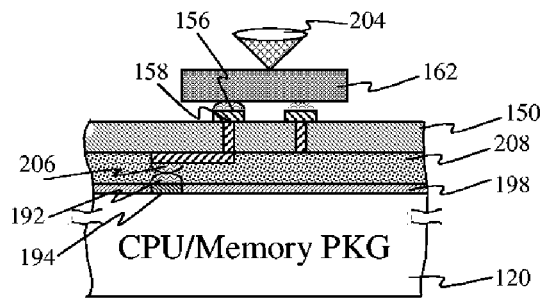
FIGS. 12A, 12B, and 12C are the enlarged schematic cross-sectional view equivalent to FIGS. 11A, 11B and 11C of an alternate embodiment for interconnecting the chip package and O-E board.
Figure 12B:
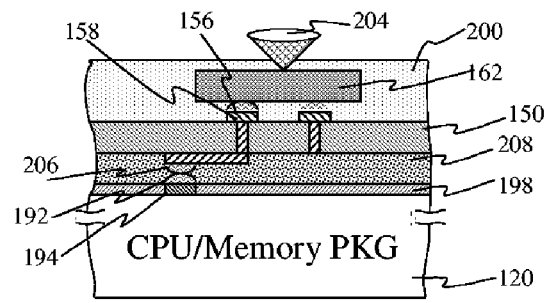
Figure 12C:
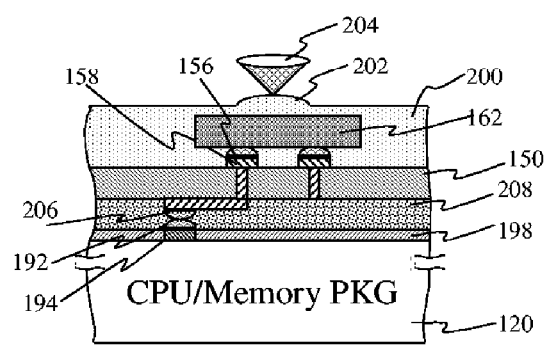

FIGS. 12A, 12B and 12C are the enlarged sectional view of the O-E printed boards equivalent to FIGS. 11A, 11B, and 11C in the preferred embodiment according to the present invention, wherein like parts are indicated by like reference numerals as used in FIGS. 11A, 11B, and 11C, so that repeated explanation is omitted here. In this preferred embodiment, the O-E board 140 is connected with the chip package 120 with help of the solder bumps or conductive polymer bumps formed on both contacts. Suitable type of the bumps includes the types previously described. In this embodiment, a compliant layer 210 is used in between the O-E board 140 and chip package 120. This layer 210 matches the differences in thermal expansion of O-E board and chip package, if any. The difference in thermal expansion may cause high stress during change of temperature and may cause fatigue and crack in the optical components and also solder bumps, electrical conductors. The coefficient of the thermal expansion of layer 210 is selected in between the CTE of substrate 150 and CTE of O-E board and chip package to compensate the thermal expansion during temperature changes. The compliant layer 210 can be formed by dispensing method, which includes spin-on, stencil, and capillary action to fill the gap between the O-E board and the chip package. Alternatively, the layer 210 can come with the O-E board, and could be formed by film deposition or spin coating, and patterning, and subsequent etching to open for the bumps. Suitable material for layer 210 includes all kinds of polymer material, which has the CTE value in between the O-E substrate and chip package. One suitable material is HYSOL Brand FP4520 (commercialized by Dexter Electronics Materials). Compliant layer 210 can be single layer or multiple layers of different material to compensate the CTE of chip-package and O-E board can also be used.

Figure 13A:
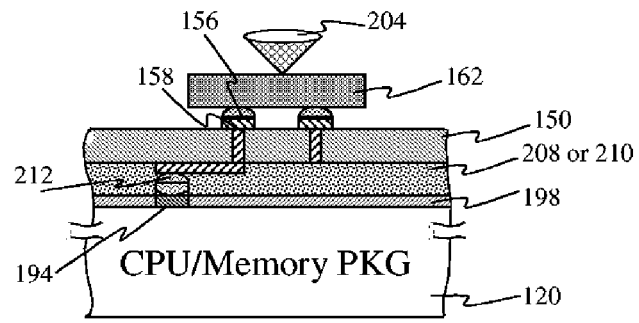
FIGS. 13A, 13B, and 13C are the enlarged schematic cross-sectional view equivalent to FIGS. 12A, 12B and 12C of an alternate embodiment for interconnecting the chip package and O-E board.
Figure 13B:
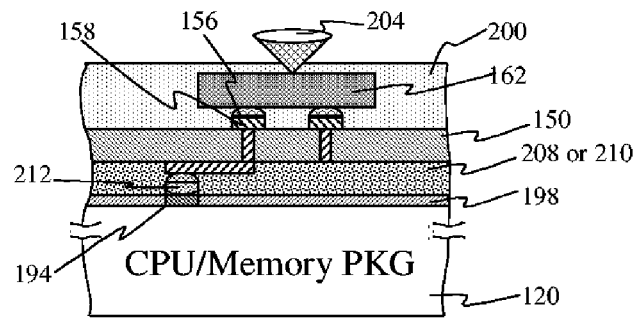
Figure 13C:
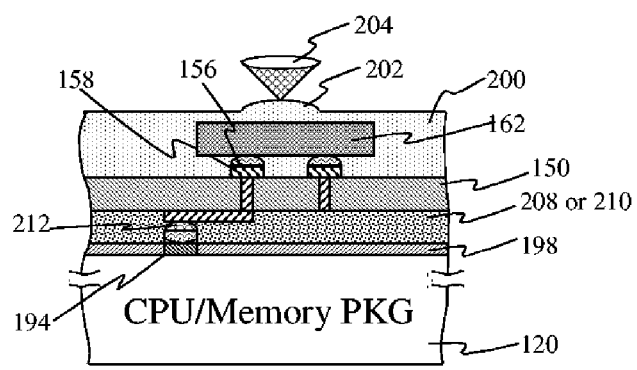

FIGS. 13A, 13B and 13C are the enlarged sectional view of the O-E printed boards equivalent to FIGS. 12A, 12B, and 12C in the preferred embodiment according to the present invention, wherein like parts are indicated by like reference numerals as used in FIGS. 12A, 12B, and 12C, so that repeated explanation is omitted here. In the preferred embodiment, single bumps 212 are used on the chip package contact 194. Suitable bump material includes alloy type solder, conductive polymer, as described previously. The bumps can be formed using the dispensing technique or the dot-shot, as explained earlier. The height of the bumps is selected as required. The compliant layer 206 or 208 in between O-E board and chip package could be adhesive as explained previously.

Figure 14A:
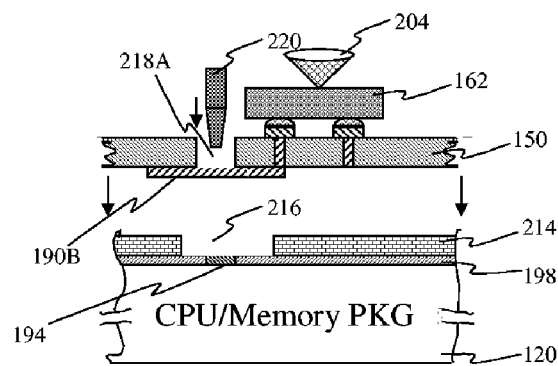
FIGS. 14A, and 14B are the enlarged schematic cross-sectional view equivalent to FIG. 8 of an alternate embodiment for interconnecting the chip package and O-E board.
Figure 14B:
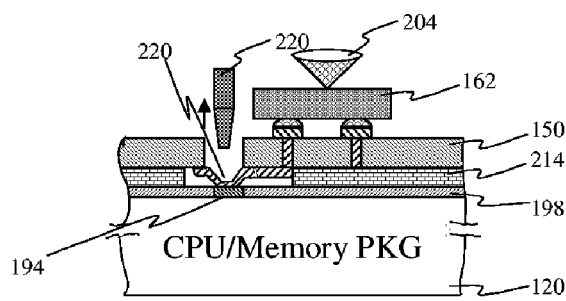

FIGS. 14A and 14B are the enlarged sectional view of the O-E printed board and chip package in the preferred embodiment according to the present invention, wherein like parts are indicated by like reference numerals as used in FIGS. 11A, 12A, and 13A, so that repeated explanation is omitted here. Referring to FIGS. 14A and 14B, adhesive layer 214 is used in between the O-E board 140 and chip package 120. The preformed hole 216 and 218A through the adhesive layer 214 and O-E substrate 150, respectively, helps to make interconnects between the O-E board and chip package. A bonding tool 220 is used through the holes to make the bonded connection 222 between O-E printed circuit 190B and the chip package contacts 194. The layer 214 can be the preformed layer placed onto the chip package at the edge of the contacts. Alternatively, the layer 214 can be the separate from O-E board, and chip package, and it can be the form of the thin flexible layer, and is used while bonding. The adhesive layer 214 is electrically insulating adhesive. Suitable material for this adhesive layer covers all polymer-based adhesives having high electrical insulation. The bonded tool can be thermocompression, or thermosonic tool, which can generate heat to make bonding. The metal for the printed circuit 190B is to be high thermal conductivity and those are gold, copper, pladium or nickel.

Figure 15A:
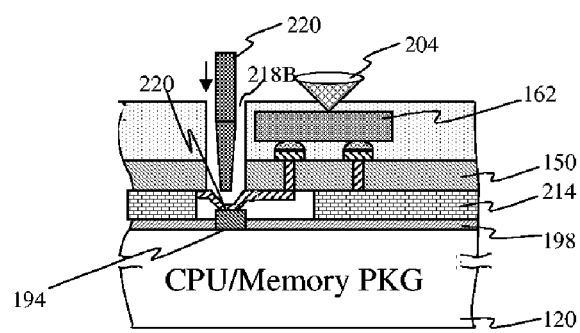
FIGS. 15A, and 15B are the enlarged schematic cross-sectional view equivalent to FIG. 8 of an alternate embodiment for interconnecting the chip package and O-E board.
Figure 15B:
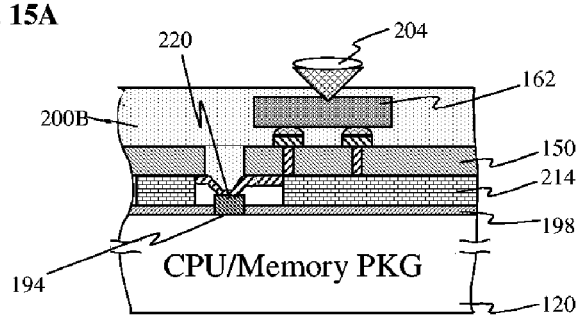

FIGS. 15A and 15B are the enlarged sectional view of the O-E printed board and chip package in the preferred embodiment according to the present invention, wherein like parts are indicated by like reference numerals as used in FIGS. 11B, 12B, 13B, and 14, so that repeated explanation is omitted here. In this preferred embodiment, the O-E board comprises the printed circuit on the substrate 150, bonded optical component 162, and the encapsulation of the optical components. The encapsulation includes a preformed hole 218B through which bonding tool helps to make the connection 220 between O-E circuit 190B and chip package contacts 194. Refer to FIG. 15B, following the formation of the connection 220, the hole can be filled by adhesive. For filling, standard dispensing technique as described earlier can be used. Suitable adhesive material includes the any electrically insulating adhesive or the same adhesive of encapsulation.

FIGS. 16A and 16B are the enlarged sectional view of the O-E printed board and chip package in the preferred embodiment according to the present invention, wherein like parts are indicated by like reference numerals as used in FIGS. 15 and 13C so that repeated explanation is omitted here. In the preferred embodiment, the O-E board comprises the printed circuit on substrate 150, bonded optical components 162, encapsulation and the microlens. The microlens is formed as mentioned previously. The material can be the same as the encapsulation material or different. Alternatively, molded plastic lens for either focusing or collimating purpose can also be used. The material and formation are already explained previously.

The O-E board and its interconnects with the chip package described above can be directly incorporated in envisioned off-chip module integration applications that require the vertical interconnection. The printed circuit of O-E board is employed to covert/receive high speed optical signal using of the optical components bonded on the O-E board, and also interconnects upper chip to a underlying PCB board in vertical dimension, in parallel. The advantages of this interconnect technique is that, standard cooling technique for heat dissipation from chip can be used at top (e.g. for processor) and they can be employed without any changes. As mentioned previously, only high-speed signals are converted into optically for off-chip communicating. Others such as ground and power connections can be without changes. This provides the advantages of quick implementation in the practical electronics system where high-speed off-chip interconnects are required.

Optoelectronics component (emitters for light conversion and detectors for electrical signal conversion) compatible for the O-E board 140 described above provide the in/out light in vertical direction. For light source, vertical cavity surface emitting laser (VCSEL) or edge emitting laser can be used. Suitable wavelengths of light include 650 nm, 850 nm, 980 nm, 1310 nm or 1550 nm. FIGS. 17A and 17B are the enlarged top and cross-sectional view of the array of VCSEL 174 (Ref. FIG. 7B). For simplicity in drawing, array of two VCSELs 162B and one cathode 224 are only shown. VCSEL can be fabricated using of GaAs substrate 222 for the wavelengths 650 nm, 850 nm and 980 nm VCSEL, and InP for 1310 and 1550 nm. Other suitable substrate includes semi-insulating GaAs, semi-insulating InP, Si, SiC, and Sapphire. The light 204 can be taken out from bottom of the wafer. For simplicity in bonding onto the O-E substrate 150, the contacts for anode 162B and cathode 224 can be taken from the same side. If array of VCSEL are used in the O-E substrate 150, common (single) cathode configuration for entire array, as shown in FIG. 7B can be used while fabricating VCSEL on a single wafer. Otherwise, in the case of the discrete VCSEL case, separate cathode (Ref. FIG. 6) is necessary, which can be connected together on the O-E substrate 150. Pixel sizes of VCSEL for the single mode operation are from 5 to 10 μm, and shape can be square or rectangular. For easiness in the bonding, the electro-plated metal can be deposited on each pixel, and the electrode size (diameter) may vary from 10 to 50 μm. The height can be selected as required for the bonding. Suitable metal for electrode formation includes gold, copper, nickel. This metal deposition is after ohmic contact formation for anode and cathode. As the VCSEL (as shown in FIG. 17A), is mounted on O-E substrate 150 facing-up the substrate 222 (not shown), efficient heat dissipation is possible if the diameter of the electrode (anode) is 20 to 50 μm. Suitable thicknesses of electrodes (anode and cathode) for easiness in bonding are 10 to 50 μm. The detail fabrication process is cited in literature, *IEEE/OSA Journal of Lightwave Technology*, vol. 16, no. 5, pp. 870-875,1998. can be found. The emitters can also be bonded using the flip-chip bonding technique, which enables both to electrical interconnects and to laterally self-align the components for precision optical alignment. The flip-chip bonding technique uses the solder bumps on the electrical contact pads and reflowing the solder to form the interconnections.

Referring to FIG. 18, additional polymide layer 226 can be used electrically isolate the anode, required in the bonding. Suitable polymide material includes all kinds of electrically isolated polymers. This layer may be formed by spin coating, dispensing or standard deposition technique, which includes the sputtering, CVD, evaporation polymerization, or other vapor phase deposition methods. The photolithography based patterning and subsequent etching (chemical or dry etching) makes the opening on the anode for the contacts. Alternatively, chemical mechanical polishing (CMP) may be also used to polish unwanted polymide thickness to open the anode and cathode electrode opening.

Figure 19:
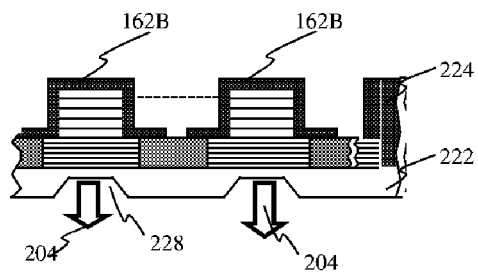
FIG. 19 is the enlarged cross-sectional view of array of VCSEL in the preferred embodiment according to this invention.
Figure 20A:
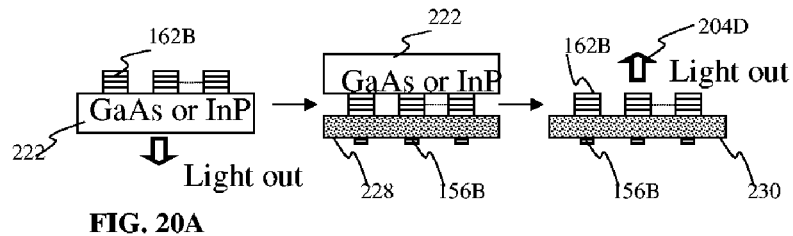
FIGS. 20A and 20B are the enlarged cross-sectional view of the bottom emitting VCSELs in the preferred embodiment according to this present invention.
Figure 20B:
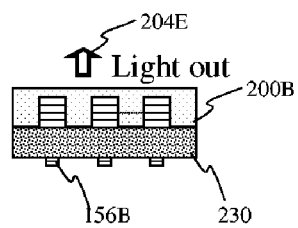

FIG. 19 is an enlarged cross-sectional view of the VCSEL array, equivalent to FIG. 17B in the preferred embodiment according to the present invention, wherein like parts are indicated by like reference numerals as used in FIGS. 17B and 18, so that repeated explanation is omitted here. In this preferred embodiment, after the wafer polished to 100 um, the portion of the VCSEL substrate is wet etched to make the trench 228 under the pixel. This enables to increase the optical power 30 to 40% of the beam 204C for the case of 980 nm VCSEL, fabricated onto the GaAs. Alternatively, the VCSEL array itself can also be transferred to the suitable substrate 230 by vapor phase epitaxial lift-off (EPL) technique, described by Chang et al., in *Fall Materials Research symposium, paper H*10.1 *of session H*10, 1997. FIG. 20A shows the VCSEL ELO process for transferring to alternate substrate 230. This enables to convert bottom-emitting VCSEl to top-emitting VCSEL, and enhance further optical output 204D. Suitable contacts 156B can be made backside of the substrate 230 to make easiness in the bonding on the O-E substrate 150. Suitable substrate for ELO process includes Si, glass, and polymer. As the VCSEL device itself is very thin varying from 1 um to 6 um, top surface of the VCSEL should be high adherence to the transferred substrate. Increasing adhesion can be possible using of the thin layer of metal layer on the VCSEL, and metal includes Tungstant and Chromium for enhancement of the adhesion. Noted here that thick n+ layer in the case of n-substrate (or p+ layer in the case of p-type substrate) is desirable prior to epitaxial growth of the VCSEL structure for the case VCSEL, which undergoes through the ELO process. This enables to increase the yield of the ELO process. After transferring the VCSEL to the alternate substrate friendly for manufacturing, the exposed VCSELs 162B can be encapsulated by transparent adhesive layer 200B, as is shown in FIG. 20B. Spin coating, followed by proper curing by UV irradiation or temperature treatment, can form the adhesive or polymer layer 200B. Alternatively, the layer 200B can be also formed by standard deposition techniques such as sputtering, CVD, evaporation polymerization, or vapor-phase deposition. The CMP technique is also used for planarization (not shown) of the surface of the layer 200B. In this case, a thin protective layer of metal is preferably coated onto the VCSEL prior to the formation of the encapsulation layer 200B.

Figure 21A:
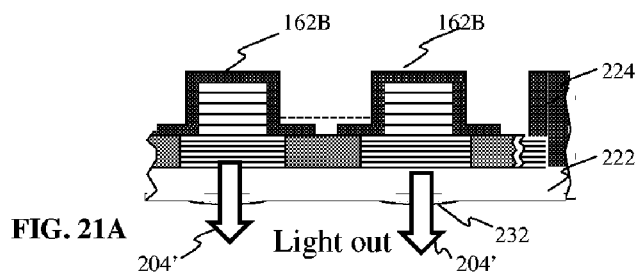
FIGS. 21A, 21B and 21C are the enlarged cross-sectional view of the bottom emitting VCSELs equivalent to FIGS. 17B, 18, 19, and 20B of alternate embodiments according to this present invention.
Figure 21B:
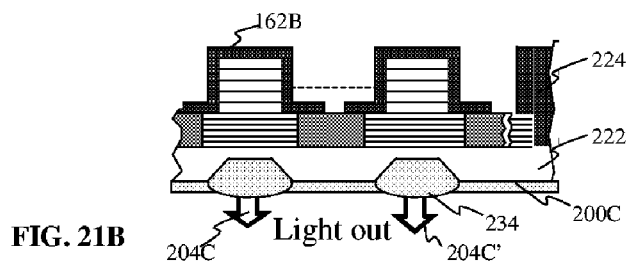
Figure 21C:
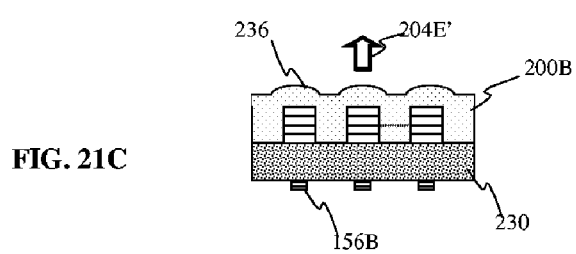

FIGS. 21A, 21B, and 21C are the enlarged cross-sectional view of the VCSEL arrays, used to FIG. 17B, in the preferred embodiment according to the present invention, wherein like parts are indicated by like reference numerals as used in FIGS. 17B, 18,19, and 20B, so that repeated explanation is omitted here. Integrated microlens 232 (or 234) are formed on to the back surface of the substrate 222 to correct the optical beam profile so that laser beam propagating towards the back surface is focused with a low divergence angle (collimated beam) for coupling into the waveguide in the PCB. Referring to FIG. 21C, the microlens (es) 236 can be formed using the same encapsulation layer 200B using the standard mcrolens process. This microlens enables to increase the tolerance in the bonding Also this enables to reduce the driving current as required, because the optical power is increased as compared with that of the VCSEL without the microlens. The microlens may be a refractive lens, which can be prepared, for example, a photoresist reflow process, and/or a defractive lens, which can be prepared, for example, by dry etching. The optical axis of the microlens(es) preferably passes through the light-deflecting surface. To make a collimated output beam, the focal length of the microlens should be designed to be around twice of the substrate thickness, which can be quite easily achieved using the standard microlens fabrication techniques such as reflow of the resist (refractive lens) and dry etching (defractive lens). Suitable materials for the microlens(es) include adhesive or epoxy, or polymer materials having the refractive indices over 1.56.

FIGS. 22A, 22B, and 22C are the enlarged cross-sectional view of the VCSEL arrays, used in FIG. 17B, in the preferred embodiment according to the present invention, wherein like parts are indicated by like reference numerals as used in FIGS. 17B, 18, 19, and 21, so that repeated explanation is omitted here. In the preferred embodiment, array of top emitting VCSEL 162C to be used in O-E board 140, are fabricated from GaAs or InP, 222. The advantage of top emitting VCSEL as compared with that of bottom emitting VCSEI is that the absorption of the light due to the substrate is not exist. This enables to have high optical power of the beam 204F at the fixed driving current. In order to avoid complexity in bonding, the anode electrode 238 can be taken out from bottom of the substrate through via hole, which can be made by wet or dry etching of the substrate 222. Insulation layer 240, such as SiO2 or SiNx is deposited prior to filling the hole with metal, enabling to isolate the bottom contacts 242 of the anode electrode from the cathode (which is back surface of the substrate). Referring to FIGS. 22B and 22C, the encapsulation layer 200B using of the adhesive is formed on the top of the VCSEL. This enables VCSEL protecting from damage during the assembly and thereafter in long run operation. The micro-lens of 244 is formed using of the same adhesive layer 200B or separate layer for microlens. The formation of the encapsulation layer and microlens are described earlier, so that the repeated explanation is omitted here.

FIGS. 23A, and 23B are the enlarged top and cross-sectional view of vertical light emission device using of the edge-emitter, taken along C-C' direction of FIG. 23A, in the preferred embodiment according to the present invention, wherein like parts are indicated by like reference numerals as used in FIGS. 22A and 22B, so that repeated explanation is omitted here. The requirement of the high speed and high capacity optical transmission system pushes the development of high-speed edge-emitter technology, and now this technology is well matured that high speed edge emitters having the bandwidth of 10 GHz and above are relatively inexpensive. As one of the main objective of this present invention is to make the cost-effective optical interconnects for inter-chip connection, low-cost edge-emitter is also thought as the preferred embodiment to use in the O-E board 140 as described earlier. Referring to FIG. 5, in the present invention, the optical signal transmitting and receiving are performed in vertical direction, and thereby, the emitter need to be bonded in a way to provide the surface normal emission. Here vertical emission is done using of the edge-emitter in conjunction with a mirror to redirect the optical beam so that optical beam passes through the underlying the optical media. The vertical emission device 246 as shown in FIGS. 23A and 23B, illustrates a platform 246 with an edge emitter 246. The platform 246 comprises with two section; mounting section 246A and beam reflecting section 246B. The reflecting section 246B has an inclination surface 246B' having an angle of theta to reflect the beam 204 in vertical direction. The angle of inclination theta of the reflecting surface 246B' is totally internally reflected at the reflected surface 246B'. The minimum angle theta can be calculated from the refractive index of the material forming the surface 246B' using the Snell's Law. In the case where the reflecting surface 246B' acts as the mirror, the angle of inclination should be 45 degree. In this case, the surface is highly reflective. However, in the case where the reflecting surface is not totally reflecting (i.e. no reflecting coating), optimized theta design for total reflection is necessary. Suitable carriers for the platform 246 include Si, GaAs, InP, SiC, polymer, glass, and ceramics such as AlN, Al2O3. The surface 246B' should be highly reflective, and it can be formed by highly reflecting metal coating or deposition technique. Suitable reflecting metal includes aluminum, gold, tungsten, and chromium. During bonding, the edge emitter 248 is positioned and aligned with the help of the preformed alignment markers on the platform. In this technique, the sub-micrometer range alignment can be possible. Additionally, or alternatively pre-formed pedestals on the platform 246 can be used for positioning and aligning. In simplicity of drawing, single device is shown. However, array of the edge-emitters, either discrete or monolithically fabricated on a single wafer, can also be used as illustrated in FIGS. 23A and 23B. The electrical connection 250 as required can be made onto the platform 246, and/or taken out to the back surface through VIA hole or through wrapping (not shown) the metal sheet from top to bottom. For high-speed connection, proper transmission line design may necessary for avoiding the deterioration of the electrical signal before lunching to the edge emitter 248.

Referring to FIGS. 23C and 23D, further the device 162 comprises the encapsulation layer 200B following bonding the edge-emitter (array) 248. The type of material and its formation are already described earlier, so that repeated explanation is omitted here. Following encapsulation, planarization can be done using CMP. As referred to FIG. 23D, further the device 246 comprise the microlens(es) 252 on the top of the encapsulation layer 202B. The type of materials for microlens(es) 252 and microlens(es) formation are already described previously, so that repeated explanation is omitted here.

Figure 24A:
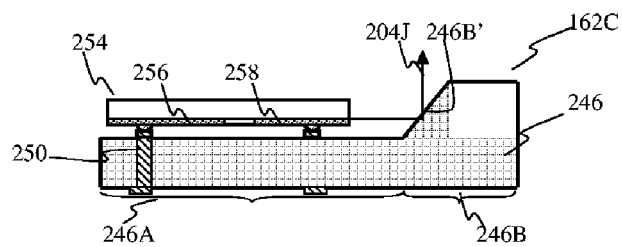
FIGS. 24A, 24B and 24C are the enlarged cross-sectional view of the edge emitting light source with the monolithic modulator, and the means equivalent to FIGS. 23B, 23C, and 23D of alternate embodiments according to this present invention.
Figure 24B:
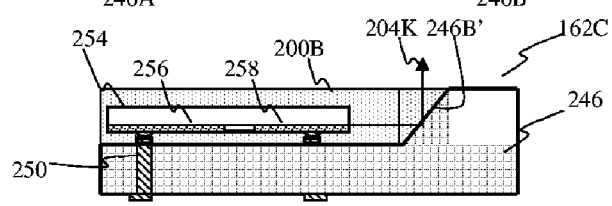
Figure 24C:
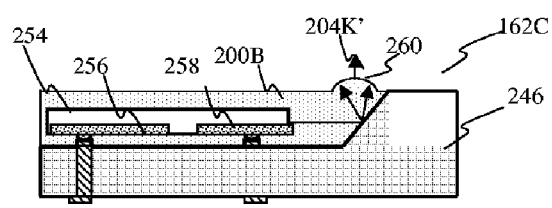

FIGS. 24A, 24B, and 24C are the enlarged cross-sectional views of vertical light emission device using of the edge-emitter integrated modulator, equivalent to FIG. 23A in the preferred embodiment according to the present invention, wherein like parts are indicated by like reference numerals as used in FIGS. 23B, 23C, and 23D, so that repeated explanation is omitted here. The hybridly integrated vertical emission type device 162D, as shown in FIGS. 24A, 24B, and 24C, comprise the modulator integrated laser diode 254, which has the laser diode 256 and electro-absorption modulator, monolithically integrated on the signal wafer, and platform 246 to reflect the beam 204J in upward direction. Suitable substrate 222 include for this device include III-V based semiconductor such as GaAs, InP, SiC, Sapphire. The electrical connection for both laser diode and modulator can be made on the front side of the platform 246, which can be taken out making and filling the VIA hole through the platform carrier 246. As the high-speed signal requires feed to the modulator section, microwave design for designing the transmission line is required. Suitable matching circuit may requires to improve the microwave performance of the electrical interconnects considering the parasitic affect due to the contacts 250. Suitable matching circuit as required can be designed on the platform carrier 246. Referring to FIG. 24B, the hybridly integrated vertical emission device 162D is encapsulated by adhesive layer 200B. The type of the material and technique of encapsulation formation is already explained previously, so that repeated explanation is omitted here. Referring to FIG. 24C, microlens(es) 260 is formed on the encapsulation layer 200B using the material and technique, as described previously. Array of device (not shown) here can also be made as illustrated in FIGS. 24A, 24B, and 24C.

Figure 25A:
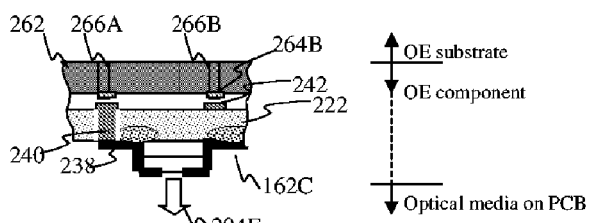
FIGS. 25A, 25B and 25C are the enlarged cross-sectional view of the connection schemes of the VCSELS with the substrate/carrier of the O-E board in the preferred embodiment according to this present invention.
Figure 25B:
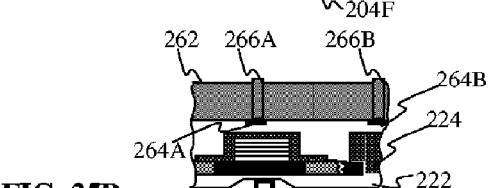
Figure 25C:
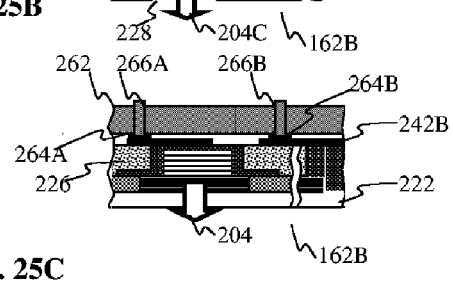

In earlier descriptions, especially from FIGS. 17 to 24, the edge-emitters, and surface emitters are directly bonded on to the O-E board, understanding that either the required driving functionality is incorporated into the chip, which is connected to the O-E board. This functionality may include the electrical signal outputs in current (direct modulation laser-diode) or voltage (external modulation using of the modulator) form, which are essential to drive the edge emitter or VCSEL or modulator. If the optical sources, means for converting the electrical signal into optical signal, have not receive essential electrical signal to generate enough optical power, the electrical driver is necessary to boost the electrical signal prior to launching to the optical sources. In that case, optical sources (edge-emitters, VCSEL or modulator integrated laser diode) in array or discrete form, described in FIGS. 17 to 24, and electrical driver chip are to be mounted onto the O-E board substrate 150. FIGS. 25A, 25B, and 25C are the enlarged cross-sectional views of VCSELs and driver chip bonding in the preferred embodiment according to the present invention, wherein like parts are indicated by like reference numerals as used in FIGS. 17 to 24, so that repeated explanation is omitted here. The VCSEL 162C or 162B (both types; bottom emitting and top-emitting type) chip(s) can be bonded on the driver chip(s) 262 using the solder bumps to connect driver chip contacts 264 and VCSEL contacts 242.

The contacts 266 of the driver in back side of the substrate is made through whole electrode, and connects with the O-E substrate. The through hole electrode is formed by following fabrication technique, consisting of (a) polishing the substrate to 50 to 150 µm, (b) masking for through-hole, (c) through hole formation using the dry etching technique such as ECR-RIBE, RIE using appropriate reactant gas for example SiCl4 for GaAs substrate, (d) insulating layer formation, (e) patterning (back side of the substrate) and subsequent metallization, for connecting the bottom contacts 264. The driver chip with through hole electrode, and top emitting VCSEL can be bonded with the substrate face down. Using of this bonding enables efficient heat dissipation from the driver and VCSEL for the case of the driver chip 262 and the top emitting type VCSEL 162C, the substrate of which are faced down. For the case of bottom emitting VCSEL 162B, the substrate of which is face up, larger diameter of metal electrode of the anode makes efficient heat dissipation. For this, diameter is 10 µm to 50 µm. High conductive metal such as gold, copper, nickel preferably used for the electrode formation, as described previously. The type of solder material and bonding process are the same as described previously. Flip-chip bonding technique can be used for bonding and for self-alignment. Alignment marker can be used on to the driver chip for pre-align the electrical contact pads. Using alignment marker and also flip-chip bonding enables the bonding as low as pad diameter of 5 µm with sub-micron range accuracy in x-y direction. Noted here that, for simplicity in the drawing, the single driver and VCSEL chips are shown. However, similar way of bonding can be performed for the array of the driver on single wafer and array of the VCSELs on a single wafer, monolithically fabricated together. Both driver chip and VCSEL can be fabricated independently and bonded hybridly, as mentioned previously, Suitable substrate and technology for driver chip fabrication include Si substrate using the standard Si CMOS or Si: Ge technology, or III-V semiconductors substrate such as GaAs, InP, GaN using standard III-V technology.

Referring to FIGS. 26A and 26B, the driver 162C (or 162B)) can be also bonded on to the common carrier 268. Suitable carrier substrate includes Si, III-V semiconductor substrate, SiC, ceramics such as AlN, $Al_2O_3$, sapphire, all polymer material having electrical insulation such as polycarbonate, PMMA, ethyrin, flex polymer. The electrode 272 on the common carrier 268, interconnects driver chip contacts 264A and VCSEL anode contacts 242A. The contacts 270A and 270B of the carrier 268 connect with the O-E substrate, facing optical component and driver down. The transmission line for high speed signal, and also matching circuit (not shown) considering parasitic affect due to the solder bumps, through hole electrode can be designed for avoiding electrical signal fidelity, and those can be formed either on the common carrier 268, or can be incorporated into the driver chip. Alternatively, VCSEL and driver can be fabricated monolithically on a single wafer, for example on the GaAs or InP substrate or GaAs on Si substrate.

From FIGS. 25 and 26, particular VCSEL and driver connections are illustrated in the preferred embodiments according to the invention, for simplicity. Similar technique can be used for the emitter case as described in FIGS. 17 to 24. Also, referring to FIGS. 6 and 7, two contacts for VCSEL is shown for the simplicity of the drawing. However, the contacts cane more than two, as required for connecting the optical components with the O-E substrate 150.

For inter chip communication, transmitting and receiving signal are essential. In optoelectronics off-chip interconnects, O-E board 140 in accordance with the present invention also comprises the optical-electrical conversion capability. In this case, optical detectors are incorporated on each O-E board at the location of the data or signal-input ports. Each optical detector converts their respective light signals to corresponding electrical representation, and provides their representation to input circuit of the chip through corresponding connection pads located in the chip package. The electrical represented signal may or may not require amplifying. Amplifier may incorporate inside the chip or discrete amplifier may require prior to input to the chip. This is analogy to the transmitter with separate driver, as described in FIGS. 25 and 26. Electrical signal in proximity to the optical detector is essential, and it can be achieved using of the suitable optical detectors (and receiver) having proper responsivity and bandwidth, and proper interconnects on to the O-E substrate. All kinds of the photodetector structure can be used in O-E board. Suitable structure p-n, p-i-n, metal-semiconductor-metal.

From FIGS. 17 to 25, although the optical transmitting means (i.e. optical sources) using of the surface emitting devices are illustrated, a similar approach can be used for the receiver (i.e optical detectors). For example, optical surface emitting type of devices (and also drivers) can be replaced by surface coupled photodetectors (and amplifier or transimpedance amplifier), including surface incidence and bottom-incidence type photodetectors. The bonding techniques including the enhancement of manufacturing tolerance by including the lens etc, as described previously, can be all applied to the photodetector case, so that repeated explanation herewith are omitted. Illustration hereafter regarding photodetector includes type of the detectors and their performance improvement in accordance with the present invention.

FIGS. 27A and 27B are enlarged top and cross-sectional views taken along A-A' direction of FIG. 27A for the surface emitting type photodetector in the preferred embodiment in accordance with the present invention. The photodetector 164 comprises a semiconductor material with a p-n junction formed in the material, with the p-type doped region electrically coupled to one electrode 274A, and n-type doped region is coupled with other electrode 274B. The p-n junction generates current called photocurrent while light is incident and absorbed in p-n junction 276. The photo current from photodetector can be collected by the electrode located at the top and bottom of the photodetectors 164. In easiness in the bonding (like transmitter) as described previously, the top electrode 274A can be taken to the bottom side of the substrate 222B through hole electrode 276, fabricated by the process, as mentioned previously. In the present invention, as the O-E substrate where photodetector is bonded, is vertically located in between the chip and optical signal propagation media, the bonding and receiving the optical signal in accordance with this invention are preferably in both side of the photodetector, and the illustrated detector fulfill this criteria.

FIGS. 28A and 28B are enlarged top and cross-sectional views taken along B-B' direction of FIG. 28A for the bottom incidence type photodetector in the preferred embodiment in accordance with the present invention, wherein like parts are indicated by like reference numerals as used in FIGS. 27A and 27B, so that repeated explanation is omitted here. In the preferred embodiment, the light beam 280 is emitted to the detector 164 from back-side of the substrate 222B, and the bonding for electrical connections are carried out through the electrodes 282A and 282B, located at the front (top) side of the photodetector 164. The n-doped region electrode in the case of the n-substrate, can be formed on the front surface of the photodetector by the process consisting of, (a) photolithography based patterning, (b) wet etching or dry etching using ECR-RIBE, RIE, (c) formation of the insulation layer, and (d) metallization for the cathode electrode. The bonding of this photodetector onto the O-E board substrate 150 can be done using the solder bump or conductive polymer bump by using the technique as described previously.

FIGS. 29A and 29B are enlarged top and cross-sectional views taken along B-B' direction of FIG. 28A for the bottom incidence type photodetector in the preferred embodiment in accordance with the present invention, wherein like parts are indicated by like reference numerals as used in FIGS. 27A and 27B, so that repeated explanation is omitted here. In the preferred embodiment, the microlens 286 (in FIG. 29A) is formed in the backside of the substrate 222B, located under the anode electrode 282A of the photodetector 164B. This microlens(es) enables to enhance the photodetector responsivity (ratio of photocurrent in Amp to optical power in watt). This helps to eliminate the amplifier circuit, which are either incorporating in the chip itself, or additionally including with the photodetector. Referring to FIG. 29B, the trench 288 under the active region (anode) is opened at the backside of the substrate 222B. This enables to increase the responsivity of the photodetector 164C. The trench 288 can be opened either by using the dry etching or using the technique of the vapor-phase epitaxial lift-off, as explained in previously. The backside of the photodetecor 164B can further be encapsulated (not shown) by the adhesive layer with microlens located at the trench 288, and formed using the standard microlens fabrication technique. This enables further enhancement of the responsivity, and also helps to increase the tolerance in assembly.

From FIGS. 27 to 29, the photodetectors illustrated can be fabricated onto the Si for detecting the 650 nm light, GaAs for 850 nm and 980 nm light, and InP for 1310 and above wavelength light. Also type of photodetectors illustrated here is surface incidence type photodetector. However, edge incidence type photodetector (not shown) in conjunction with 45 degree mirror (beam direction opposite to edge emitter case) can be also be used in the O-E board. Spot size converter can also be integrated with the edge incidence photodetector. This spot-size converter enables to increase coupling efficiency and tolerance in assembly. In the case of electrical driver as described in emitter (FIGS. 25 and 26), the amplifier circuit may necessary in photodetector case to amplify the electrical signal essential to input to the chip through the contacts in O-E board. The amplifier and photodetector can be fabricated independently and bonded like electrical driver as illustrated in FIGS. 25 and 26. Alternatively, the amplifier and other related circuit such as matching circuit considering the parasitic affect due to the solder bump, electrical contacts fabricated onto a single wafer or can be incorporated in the driver circuit to achieve the electrical signal in close proximity to the photodetector and receiver (amplifier). In all illustrations, two electrodes per device are considered (to match with the O-E board as illustrated FIGS. 6 and 7). However, each device may have plurality of signal and/or power electrodes.

Description of the Waveguide Board, its Fabrication, and Mounting Technique onto the PCB FIG. 30 is a schematic plan view of a waveguide board, matching with the O-E board as shown in FIG. 6, in the preferred embodiment according to the invention. Each waveguide board 290 includes a singulated substrate 292 and singulated portion of the flex waveguide optical circuit 294. The waveguide board 290 extended from one chip to another chip required to be interconnected with. For multi-chip configuration, it may be extended to multichip. In simplicity in drawing, portion of the waveguide board 290 in one chip's O-E board side is only shown. However, similar board portion can be expected in another chip side also. The waveguide board 290 and the flex optical circuit 294 have a peripheral outline substantially similar to that of the O-E board. The flex optical circuit 294 includes a polymer substrate 292 which is flexible material, and can act as the under clad for the waveguide structure and also electrically insulating. Suitable materials for this flex substrate include the polyamide, polyester, epoxy, urethane, polystyrene, and polycarbonate. The thickness of the substrate can be from 20 um to 500 um. The waveguide boards 290 include an array of the optical waveguide circuit for propagating optical signal for off-chip communication, and an array of external contacts 296 and 298 for electrical connection with the upper O-E board 140, and lower PCB board 101, respectively. For simplicity in FIG. 30, optical waveguide circuit 294 and external contacts 296 (and 298) are illustrated in an array of two rows. Some dense arrays can cover entire face of the waveguide board 290, including thousands of the waveguide circuit for optical connection, and external contacts for electrical connection.

Figure 31A:
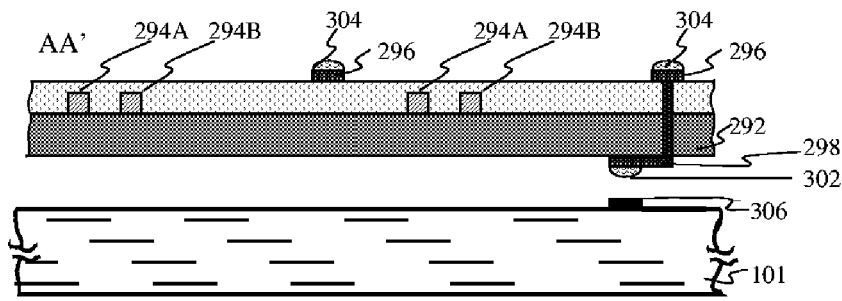
FIGS. 31A and 31B are the enlarged cross-sectional view of the waveguide board taken across AA' and BB' directions, respectively, of FIG. 30, in the preferred embodiments according to this present invention.
Figure 31B:
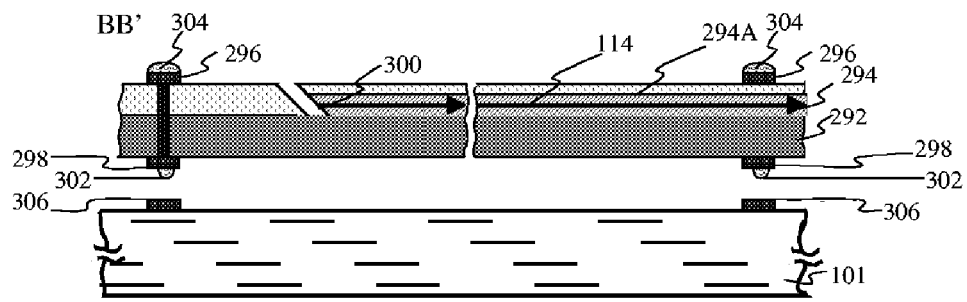

FIGS. 31A and 31B are the enlarged cross-sectional views of the waveguide board taken across A-A' and B-B' direction of FIG. 30, illustrated in accordance with the present invention, where the same reference numerals are the same parts, so that repeated explanation are omitted here. The waveguide board provides the electrical connections between top O-E board 140 and bottom PCB board 101, and also provides optical connection on the PCB board for off-chip communication. The waveguide board comprises substrate 292 with waveguides optical circuit 294, and the electrical contacts 296 and 298. The fabrication processes of the waveguide board are described later. The waveguide optical circuit 294 includes the optical circuits 294A and 294B for the transmitting and receiving the optical signals 114 (and 116 not shown in FIG. 31B) to and from the counterpart chip. Each waveguide include two 45-degree mirrors 300 at the end to redirect the beam from vertical to horizontal direction, and vice-versa. The electrical contacts 296 and 298 located on the top and bottom surface of the waveguide board 290 makes electrical connection between the O-E board 140 and PCB board 101. Electrical connections include the power and ground connection along with and without the low speed electrical signals, if necessary. The electrical connections of the waveguide board 290 to the PCB board 101 can be performed by reflowing the solder bumps 304 (and 302) on the contacts 298 (and 296) or by the pin/socket connections (explained later). Following the mounting of the waveguide board on the PCB board, the O-E board with the chip-package is mounted (explained later).

FIGS. 32 to 35 are the cross-sectional views showing the fabrication processes of the waveguide board in the preferred embodiments according to the invention. The core layer 306 is formed onto the substrate 292 using the techniques such as spin-coat, or standard deposition techniques such as sputtering, evaporation polymarization, or vapor-phase polymarization. Spin-coat is preferable, which makes the fabrication process inexpensive. Other standard process can also be also used for forming core layer 306. If the spin-coat is used for guiding layer formation, two steps temperature curing may be used for hardening which makes the uniform surface. The core layer 306 has the refractive index higher than the substrate 292, essential to guide the light beam. For waveguide core, the thickness is from 3 um to 10 um, and can be selected based on the refractive index of the core layer 306. Photolithography based patterning, and subsequent etching using the ECR, RIBE or milling form the core 308 of the waveguide 294. This is followed by the formation of the clad layer 310. The metal contacts 296 and 298 at both ends of through-hole electrode 309, is formed top and bottom side of the waveguide board. Each metal contacts may have the metal balls, namely solder bumps, to help for the bonding with the PCB board 101.

Again standard photolithography based patterning, etching, and metallization can make the electrodes 309 for external electrical contacts 296 and 298 required for O-E board and PCB connections. Etching for hole formation may include the process such RIE, ECR-RIBE, or milling. Laser drilling technique can also be used for making the hole. In this case preformed alignment marks (not shown) on the substrate 292 can be used for positioning the hole to be opened, and the alignment mark can be formed prior to forming the core layer. Alternatively, the photolithography based patterning for positioning can also be used for hole formation.

To etch 312 for 45-degree mirror 300, laser drilling or direct cutting techniques can be formed using the technique such as Laser drilling or knife-cutting method following the photolithography based patterning. The patterning can alternatively can be formed at the same time of patterning formation for opening the hole for electrodes 309. For using the laser drilling technique, excimer laser having the wavelength 1.024 μm can be used. Appropriate adjusting the power and pulse width of the laser can make the uniform etching making smooth mirror. In the case of laser drilling technique, either laser beam can be positioned 45 degree with respect to the substrate (placed in horizontally), or the substrate can be inclined 45 degree with respect to the laser beam, placed horizontally or vertically. In the case of direct cutting technique, diamond blade can be used for etching 312, either blade or substrate can be moved at 45 degree for cutting the portion for mirror formation. Alternatively, 90-degree V-shaped diamond blade (not shown) can also be used for cutting the waveguide portion. The reflectivity of the mirror 300 can be increased by depositing the reflective metal, which includes gold, aluminum, copper, tungsten, chromium, and platinum. These metals can be deposited using the standard deposition techniques such as sputtering, thermal evaporation, ion-beam evaporation, or CVD.

The substrate 292 can be a flex or a rigid substrate. If the substrate is flex type, the substrate include all kinds of the flex polymer, and this includes Rigid substrate includes also rigid polymer, ceramics such as quartz glass, silicon, or polycarbonate, ethelene type for substrate can be flex polymer including the polycarbonate, silicon based glass. Additional underclad (not shown) above the substrate 292 may necessary, if the substrate 292 can't be acted as the under clad for the waveguide. The material for the under clad may include epoxy based resin (for example, styrene etc.), deuterated-polymethylmethcrylate (d-PMMA) or acrylate materials. The polymer material can be hardened using the techniques including UV or heat based curing under the temperatures varying from 100 C to 300 C. The material for core layer 306 also includes the polymer-based material, and this includes fluorine-based polymer, PMMA or PMMA based material. Fluorinated polymer includes the type of material used in the plastic optical fiber, like LUCINA (commercialized by Asahi Glass, Tokyo, Japan), and other fluorine-based polymer also includes the polymer, OPI-N1005, and OPI-N3405, commercialized by Hitachi Chemical Co., Tokyo, Japan. The d-PMMA with controlling the refractive index can also be used as the core material. The material for the upper clad 310 may include also epoxy-based polymer, as mentioned previously. Deuterated and fluorinated polymethacrylate (d-FPM) is also include for the clad material. It was seen that if D-PMMA is used as the core material and d-FPM as the clad layer, the refractive index difference (between core and clad) 1.0% could be obtained at 1310 nm and 1550 nm for single mode waveguide. Alternatively, the upper clad 310 may be omitted if the core refractive index high enough guiding the light beams through the core layer.

FIGS. 33A to 33E are the cross-sectional views showing the fabrication processes of the waveguide board in the preferred embodiment according to the invention, where the same reference numerals are the same parts, as shown in FIG. 32, so that repeated explanation are omitted here. In the preferred embodiment, two-step metallization processes can be used. First metallization is used to form the electrode 309, prior to the deposition of the core layer, and the final metallization can be done after forming the waveguide 294. The two step metallizations enable to layout the electrode contacts 298 different from the contacts 296.

FIGS. 34A to 34E are the cross-sectional views showing the fabrication processes of the waveguide board in the preferred embodiment according to the invention, where the same reference numerals are the same parts, as shown in FIG. 32, so that repeated explanation are omitted here. In the preferred embodiment, the core layer 306B is stacked on to the epoxy-resin 314, coated onto the substrate 292. The core layer 306B can be a kind of polymer sheet, thickness varying from 10 μm to 500 μm, and the refractive index is higher than the epoxy resin 314 used for bonding the polymer sheet (306B) on the substrate. This enables the fabrication process of the waveguide board simpler, and thereby reducing the cost. The core material includes the material types, as mentioned previously. The polymer sheet 306B can be polished (not shown) to adequate thickness appropriate for the core layer to guide the light beam. For polishing, chemical mechanical polishing can be used, as mentioned previously. The rest of the processes are similar, as mentioned in FIGS. 32 and 33. Alternatively, the array of complete waveguides 294 with predetermined pitch (not shown here), in the form of the flex-sheet can also be fabricated, and stacked on the flex substrate 292. Only steps necessary in that case, are the related processes for making the contacts 296 and 298.

Figure 32A:
FIGS. 32A, 32B, 32C, 32D, and 32E are the enlarged cross-sectional view of the waveguide processes taken across BB' directions of FIG. 30, in the preferred embodiment according to this present invention.
Figure 32B:
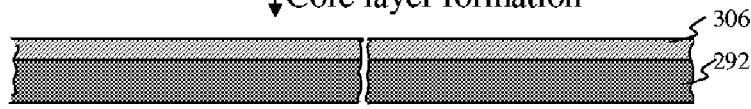
Figure 32C:
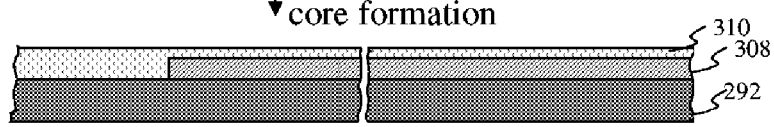
Figure 32D:
Figure 32E:
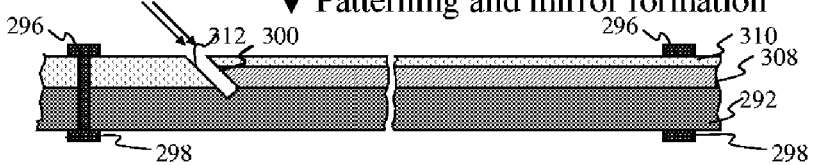
Figure 33A:
FIGS. 33A, 33B, 33C, 33D, and 33E are the enlarged cross-sectional view of the waveguide processes, equivalent to FIG. 32 of an alternate embodiment according to this present invention.
Figure 33B:
Figure 33C:
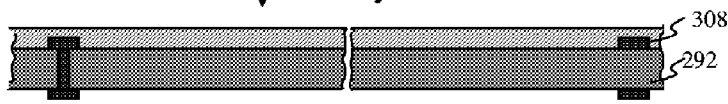
Figure 33D:
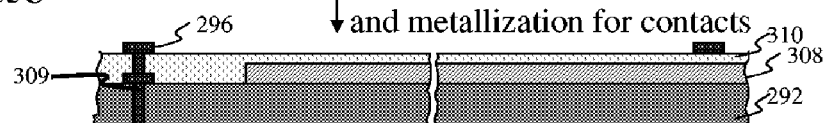
Figure 33E:
Figure 34A:
FIGS. 34A, 34B, 34C, 34D, and 34E are the enlarged cross-sectional view of the waveguide processes, equivalent to FIG. 32 of an alternate embodiment according to this present invention.
Figure 34B:
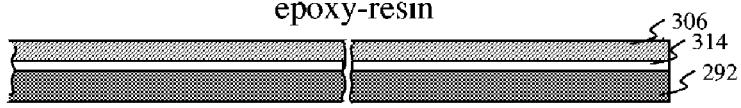
Figure 34C:
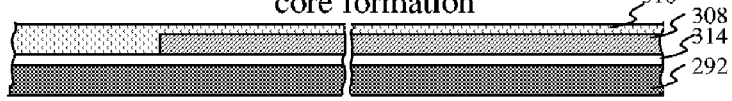
Figure 34D:
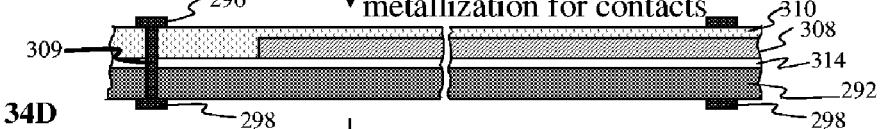
Figure 34E:
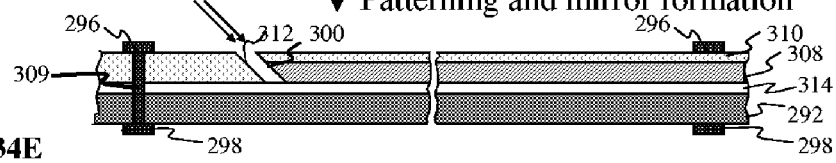
Figure 35A:
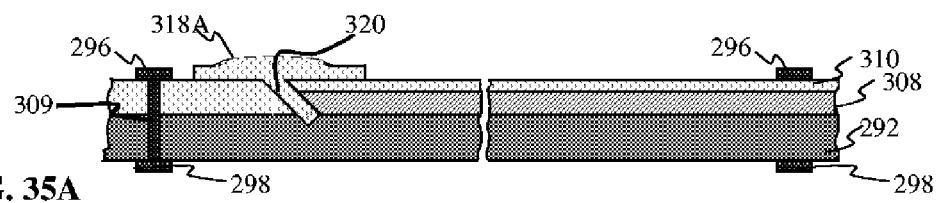
FIGS. 35A and 35B are the enlarged cross-sectional view of the waveguide board, equivalent to FIG. 32E of alternate embodiments according to this present invention.
Figure 35B:
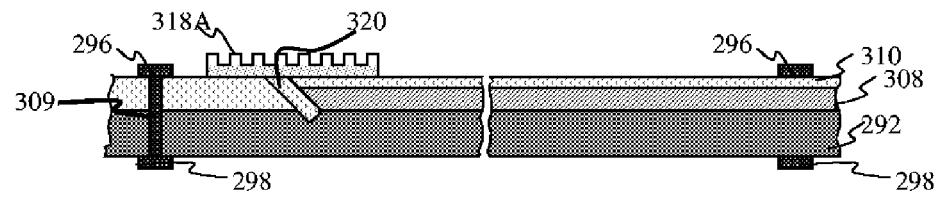

FIGS. 35A and 35B are the enlarged cross-sectional views in the preferred embodiment accordance with the invention, where the same reference numerals are the same parts, as shown in FIG. 32E, so that repeated explanation are omitted here. In the preferred embodiment, the microlens in form the defractive or reflective lens for either collimating or focusing the beam are formed following the mirror and waveguide formation. These microlens enables to increase the coupling efficiency and tolerance required in assembly process. The microlens can be in the form of concave type lens 316 or grating type lens 318. These lenses can be formed independently and bonded onto the mirror using the epoxy resin. The focal length of the microlens can be selected and designed, as required to enhance the efficiency in coupling the beam with the waveguide. The gap 312 formed for mirror formation can be filled by the same epoxy resin, which is also used for bonding the discrete microlen (es) 316 and 318. The epoxy-resin also acts as the refractive index matched for the lens, gap and core layer. The using of the epoxy-resin provides lower reflection loss, generally experienced while light passes from one medium to another medium having different refractive indices. The same type of epoxy-resin as described previously can be used for bonding purpose. In FIGS. 35A and 35B, the explanation is provided based on the FIG. 32E. The similar lens can also be used for the waveguide boards, as explained in FIGS. 33E and 34E.

Figure 36A:
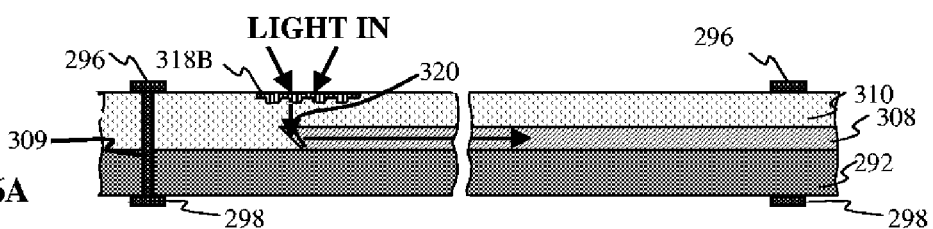
FIGS. 36A and 36B are the enlarged cross-sectional view of the waveguide board, equivalent to FIGS. 35A and 35B of alternate embodiments according to this present invention.
Figure 36B:
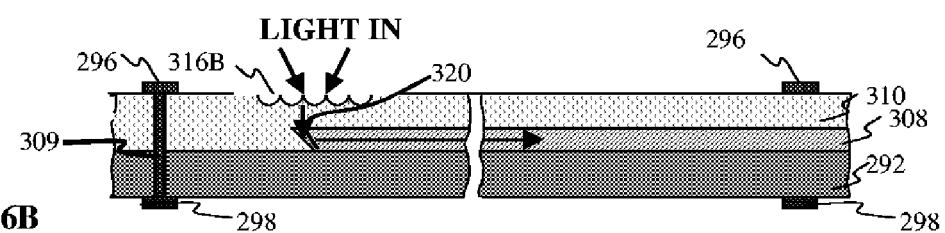

FIGS. 36A and 36B are the enlarged cross-sectional views in the preferred embodiment in accordance with the invention, where the same reference numerals are the same parts, as shown in FIGS. 35A, and 35B, so that repeated explanation are omitted here. In the preferred embodiment, the planar microlens 316B and 318B are formed onto the mirror using the same polymer material as upper clad, using the standard microlens fabrication processes technique.

FIGS. 37A to 37E are enlarged cross-sectional views showing the fabrication process of the flex optical circuit, in the preferred embodiment in accordance with the invention, where the same reference numerals are the same parts, as shown in previous, so that repeated explanation are omitted here. As the object of this invention is to achieve inexpensive board, all components used in the optical interconnection in the present invention are to be fabricated in simpler and cost-effective process. In the preferred embodiments, the flex optical circuit is fabricated which can be stacked onto the board (for optical and electrical connections), which is easily mountable or stacked onto the PCB. Referring to FIGS. 37A to 37E, core layer 306B, under clad layer 314B, the epoxy-resin, and the metal layer 324 are formed onto the substrate 322. For core layer 306B, fluorinated based polymer as mentioned previously can be used. For clad layer, polymer based material including PMMA based material, flurorinated based material having lower refractive index than core, or epoxy-resin as mentioned previously, can be used. The metal layer 324 helps for etching the substrate after the waveguide form. The substrate 322 includes rigid substrate including Si, SiC, and ceramics. The core 308B to guide the light beam can be fabricated after photolithography based patterning and dry-etching using RIE, RIBE, or milling. The formation of the upper clad 310B, and the resin layer 326 on the top of the core form the waveguide. The 45-degree mirror formation using the techniques as described previously makes the waveguide with mirror to direct the light beam. After the waveguide and mirror formation, the wet etching of substrate makes the flex optical circuit 328, stackable onto the any substrate.

Figures 38A, 38B:
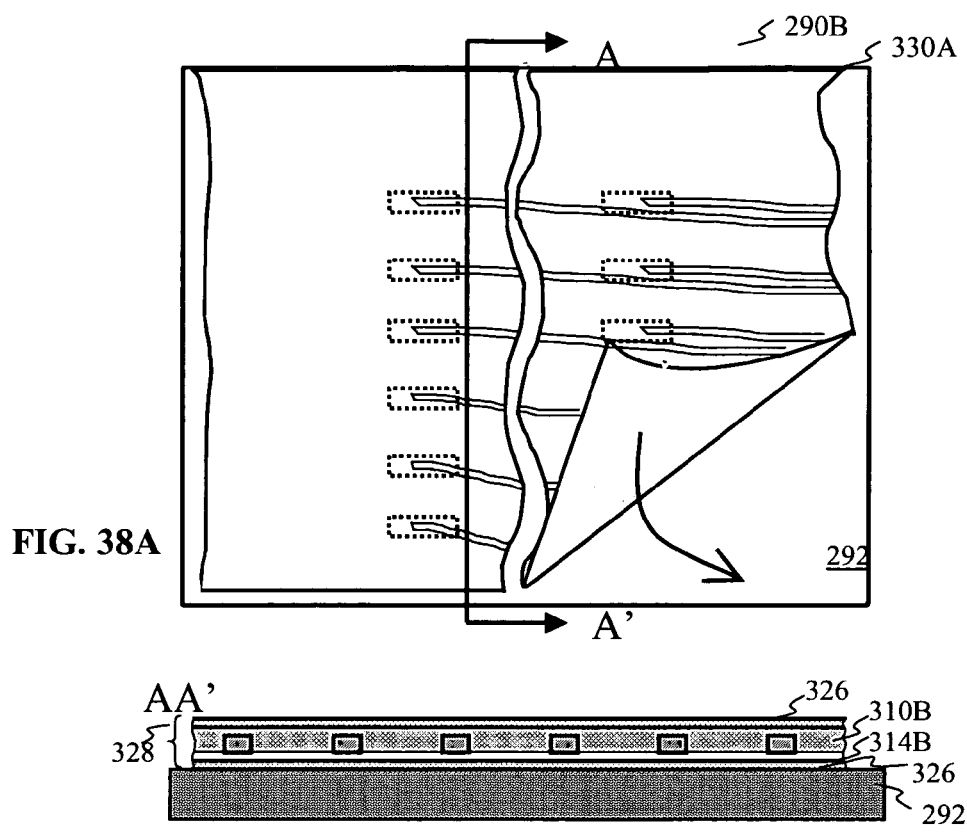
FIGS. 38A and 38B are a plan top view and the enlarged cross-sectional views of waveguide, taken across AA' direction in FIG. 38A, constructed in accordance with the invention.

The electrode formation for external electrical connection can be done after or before the flex optical circuit 328 stacked onto the separate substrate 292B. FIGS. 38A and 38B are the top and cross-sectional views of the flex-optical circuit with the underlying substrate, taken across A-A' direction of FIG. 38A, in the preferred embodiments in accordance with the invention, wherein the same reference numerals indicate the same parts as mentioned in FIG. 37, so that the repeated explanation is omitted. The flex circuit sheet 330 is stacked onto the substrate 292B using the epoxy-resin. The electrode formations through hole for external electrical connections are followed for complete the waveguide formation. The substrate can be flex or rigid, as explained before. The process is same as explained in FIG. 32D. Noted here that the flex circuit can be designed in predetermined pitch for the waveguide (receiving and transmitting), compatible for different variation of the PCB layout. In the preferred embodiment, the flex optical circuit sheet 330 is formed independently and stacks afterwards to make the waveguide board. Alternatively, flex-optical circuit can also be fabricated on to the 292B instead of the 322. In this case, the metal layer may not be necessary. Alternatively, the metal layer can be used to make two layers of the electrodes for external electrical connection, which may reduce the size of the waveguide board.

FIGS. 39A and 39B are the top and cross-sectional views of the flex-optical circuit with the underlying substrate, taken across A-A' direction of FIG. 39A, in the preferred embodiments in accordance with the invention, wherein the same reference numerals indicate the same parts as mentioned in FIG. 38, so that the repeated explanation is omitted. In the preferred embodiment, the electrode is formed in the flex optical circuit 330B (flex optoelectronics circuit) prior to the wet etching away of the substrate 322. The optoelectronics flex circuit 330B is stacked/bonded onto the substrate 292B with electrical connection. The bonding process can be the same as described in FIGS. 8 to 16. Alternatively bonding using mechanical pressing can also be used for stacking the 330B onto the 292B. This can be done using the conductive polymer bumps which is mechanically complaint bonding. In the preferred embodiment, the flex optical (optoelectronics) circuit sheet 330B and the substrate with external electrical connections are made independently, and stacked afterwards to make the waveguide board 290C. Alternatively, flex waveguide board 290C can be made using the substrate 292B from the beginning, instead of using the substrate 322.

Figure 40A:
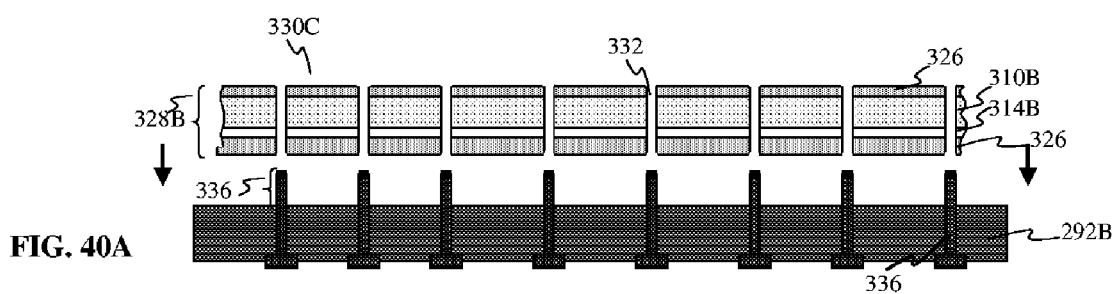
FIGS. 40A and 40B are a plan top view and the enlarged cross sectional views of waveguide equivalent to FIG. 39B of alternate embodiments, constructed in accordance with the invention.
Figure 40B:
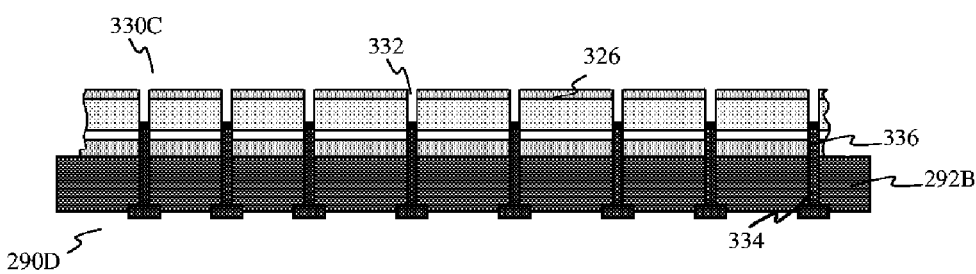
Figure 41A:
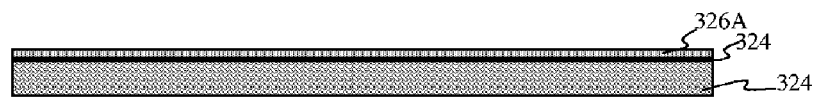
FIGS. 41A, 41B, 41C, 41D, and 41E are the enlarged cross-sectional view of the waveguide-board fabrication processes, taken across AA' directions of FIG. 38A, in the preferred embodiemnt according to this present invention.
Figure 41B:
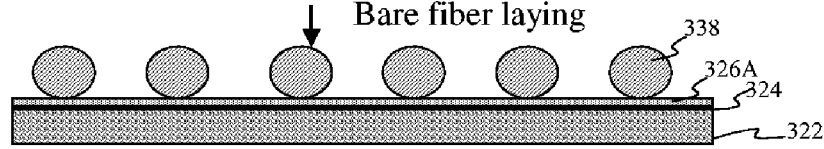
Figure 41C:
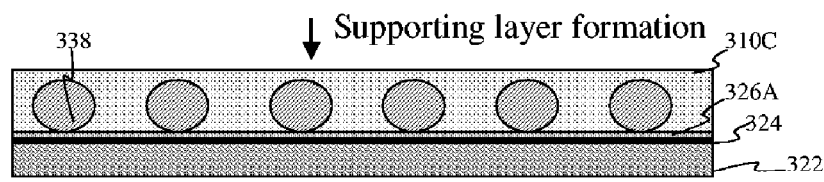
Figure 41D:
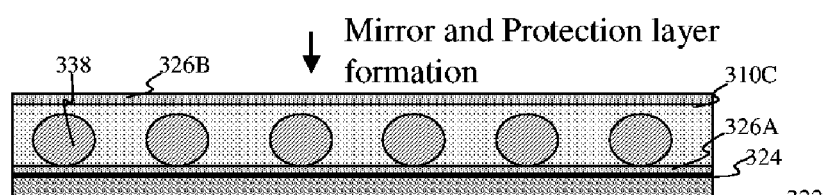
Figure 41E:
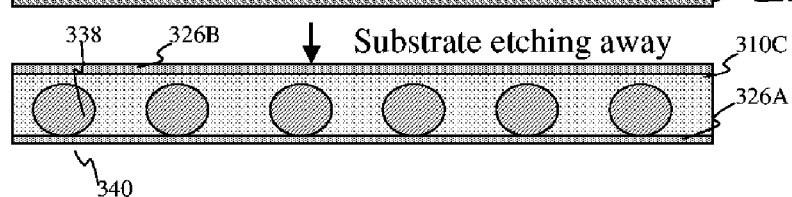

FIGS. 40A and 40B are the cross-sectional views showing the mounting of the flex optical circuit to the substrate in the preferred embodiments according to the invention, wherein the same reference numerals indicate the same parts as mentioned in FIGS. 38 and 39, so that the repeated explanation is omitted here. In the preferred embodiment, the hole 332 is opened in the flex optical circuit following the wet etching of the substrate 322. The hole can be opened using the techniques including laser drilling, dry etching, milling, after photolithography-based patterning. The electrode is formed in the substrate 292B for electrical connection. The electrode is formed in a way that the thickness is higher than the substrate thickness leaving the portion 336 on the top of the substrate. The electrode can be formed using the electroplating following the photolithography based patterning leaving the photoresist portion at the top (not shown). The thickness of the photoresist determines the height of electrode portion 336 leaving at the top of substrate 292B. The electrode 336 at the top enables to position the flex optical circuit during the mounting.

FIGS. 41A to 41E are cross-sectional views showing the fabrication process for the flex-optical circuit in the preferred embodiment according to the invention, wherein the same reference numerals indicate the same parts as mentioned in FIGS. 37 to 40, so that the repeated explanation is omitted here. In the preferred embodiment, the bare fiber 338 is laying onto the epoxy-resin 326A placed onto the substrate 322 with metal layer 324. The bare fiber is the fiber coated with thin clad layer without jacket. The thickness of the core varies from 6 μm to 100 μm, including the single-mode (step index) fiber and also the graded-index multi-mode fiber. The material can be type of material used in silica or plastic fibers. PMMA based polymer, fluorinated based polymer include the type of material used in the plastic fiber. The bare fiber can be available from the Boston Fiber, MA, Mitsubishi Chemical, Corp, Tokyo, Japan, Toray Corp, Nagoya, Japan, and Ashahi Glass, Tokyo, Japan. After the laying out the fiber, the supporting layer 310C is formed, and polishing using the CMP is carried out thereafter for planarization. The polishing process can be omitted, if the conformal layer 310C can be formed and the thickness can be controlled. Following the layer 310C formation, the mirror formation as described previously and the protecting layer 326B are formed. The wet etching of the substrate 322 can make the flex optical circuit 340. The stacking onto the alternate substrate 292B and the electrode formation for the external electrical connection follows the process, as described in FIGS. 38 and 38B, so that the related explanation is omitted here. The advantage of using the fiber in the preferred embodiment is that the related process as used in FIG. 37 for creating the waveguide circuit can be omitted, and also that the commercial bare fiber with relatively low optical loss can be used.

The fiber 338 can be laid on the predetermined position (not shown), after making the pattern using the standard photolithography technique. Alternatively, the position of the fiber to be laid on the layer 326 can also be made after making the curved (round-shaped) trenches 342 using the master 344, as shown in FIGS. 42A and 42B. The master 344 has the curved surfaces 346, equivalent to the surface of the bare fiber 338, and can be made in accordance with the layout of the fiber. The fiber 338 can be laid according to the trenches 342 onto the layer 326. The master can be a metal and can be made using the electroplating deposition.

FIGS. 43A to 43F are cross-sectional views showing the alternative fabrication process for the flex-optical circuit in the preferred embodiment according to the invention, wherein the same reference numerals indicate the same parts as mentioned in FIGS. 37 to 40, so that the repeated explanation is omitted here. In the preferred embodiment, the waveguide flex sheet is fabricated using the simple molding technology, as illustrated in FIGS. 43A to 43F. After opening the grooves 342B into 322C polymer substrate using the master 344B, the grooves 342B are filled with the precursor (UV-curable acryle resin) 348 for the core, by injecting 322C polymer into the waveguide grooves 342B. The depth of the grooves 342B is equal to the core thickness, and it includes from 5 µm to 50 µm based on the refractive index of the polymer filling up the grooves 342B. Then the excess core material is just scraped off from the surface by using the sliding means 352 such as squeegee in one direction 354. The cure material then exposed to the UV exposure (not shown) to hardening material, which take out the moisture inside the core material, and make the core 350. The precursor (UV curable acryl resin) for the upper clad 356 is covered on to the surface using the spin coating, and cured by UV radiation. This process will make the waveguide on the substrate. Noted here that polymer used for the core material must have the refractive index higher than the substrate 322C.

The master waveguide mold 344B used in FIG. 43, can be made as illustrated in FIGS. 44A to 44E. A photoresist 360 for UV radiation are coated on the substrate 358 for example glass substrate. The thickness of the photoresist determines the depth of the grooves in the patterned substrate. This is equal to the core thickness of the optical waveguide, and it includes from 5 µm to 50 µm based on the refractive index of the core material, as mentioned earlier. The substrate was exposed to the UV radiation through a mask on which the required waveguide pattern 362 can be made, and developed for the pattern for the photoresist. The positive and negative resist can be used for this purpose, and the opposite pattern can be used for this purpose. Next metallic pattern 364 can be electroplated onto the waveguide mold. The metallic plate 344B used as the waveguide mold.

Alternatively, the waveguide could be fabricated also onto special substrate and only waveguide portion (sheet) can be transferred to the PCB board. The transfer can be possible using any kind of treatment, such as the heat treatment or radiation such as UV etc. The substrate and waveguide material must have the property of high sticking coefficient at the room temperature, but the low sticking coefficient under certain treatment.

Figure 46A:
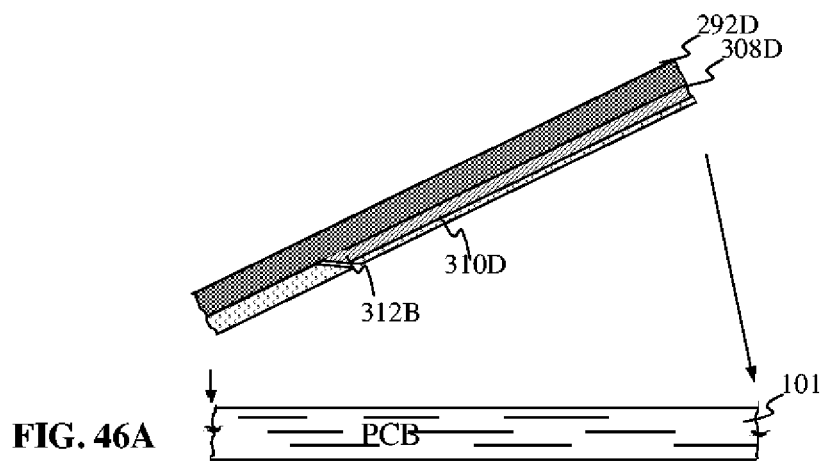
FIGS. 46A and 46B are the enlarged cross-sectional views of waveguide mounting techniques in the preferred embodiment, constructed in accordance with the invention.
Figure 46B:
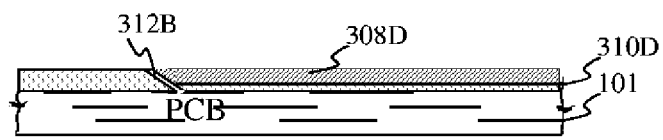

FIGS. 45A to 45C are the schematics showing the structure of transferable waveguide (to the PCB) in the preferred embodiment, wherein the same numerals represent the same parts as mentioned in earlier. The waveguide core 308D with upper clad 310D can be fabricated using the technique as mentioned previously. The mirror 312B in this case also can also be made using the technique of knife cutting or laser drilling techniques. The difference of the mirror in this case as compared with previous waveguide, is that the direction of the mirror is opposite so that when it transferred to the PCB, the mirror becomes 45 degree mirror to redirect the light in vertical direction. FIGS. 46A and 46B are the schematics showing the transfer technique of the waveguide from the substrate 292D to the PCB 101. Once the waveguide is transferred to the PCB, it becomes the same waveguide as shown in previously. Noted that, the electrical connection through conductor (not shown here) from the chip-package to the PCB 101 is possible through the O-E board directly bonded to the PCB. The socket can be made for this purpose. The advantage of the transferable waveguide is that, the PCB board can be designed as conventional way, and the waveguide portion is only left as determined. As the waveguide is transferred to the PCB, the waveguide area (portion) on the PCB can also be used for electrical wiring.

Figure 47A:
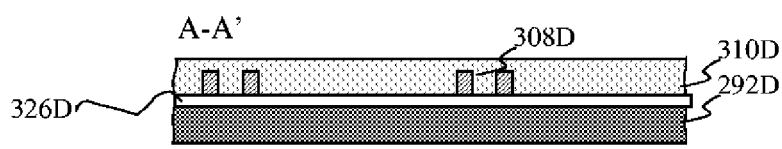
FIGS. 47A and 47B are the enlarged cross-sectional views of waveguides, taken across AA' and BB' directions in FIG. 45A, constructed in accordance with the invention.
Figure 47B:
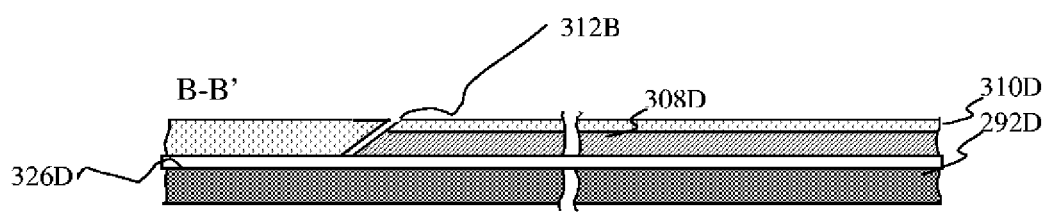
Figure 48A:
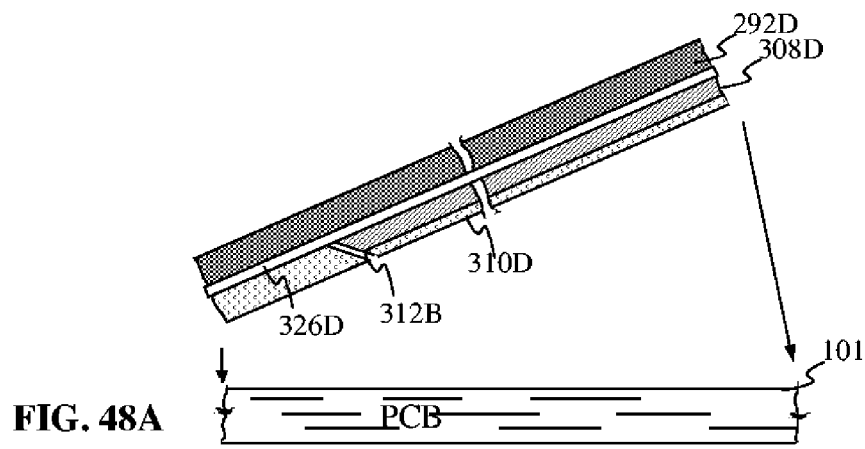
FIGS. 48A and 48B are the enlarged cross-sectional views of interconnects of the waveguide (as shown in FIG. 47) and the underlying PCB, in the preferred embodiment, constructed in accordance with the invention.
Figure 48B:
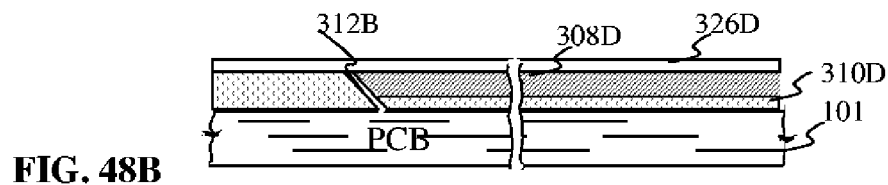
Figure 49A:
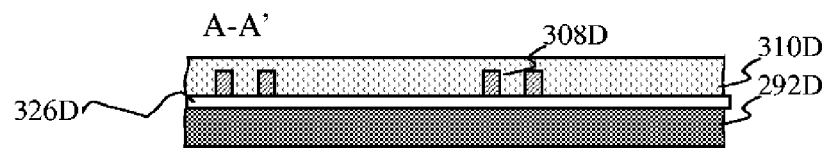
FIGS. 49A and 49B are the enlarged cross-sectional views of waveguides, taken across AA' and BB' directions in FIG. 45, constructed in accordance with the invention.
Figure 49B:
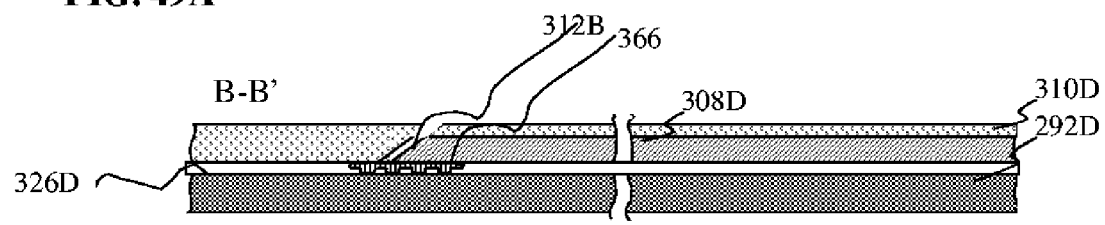
Figure 50A:
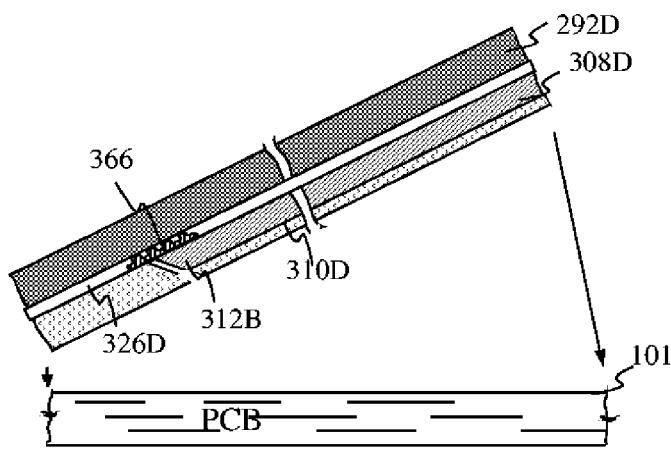
FIGS. 50A and 50B are the enlarged cross-sectional views of waveguide mounting techniques for the waveguides as shown in FIG. 49B, in the preferred embodiment, constructed in accordance with the invention.
Figure 50B:
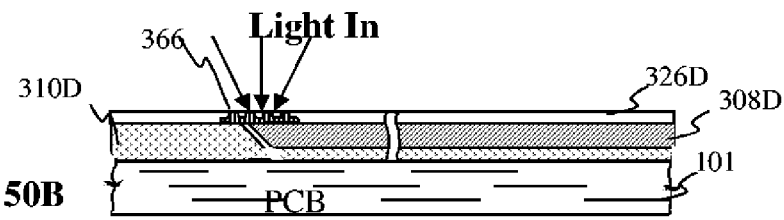
Figure 51A:
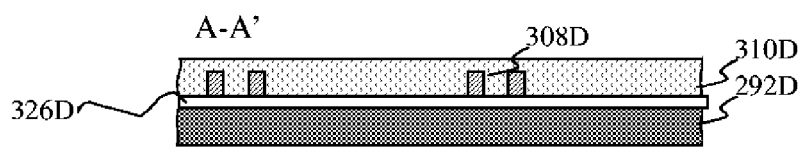
FIGS. 51A and 51B are the enlarged cross-sectional views of waveguides, taken across AA' and BB' directions in FIG. 45A, constructed in accordance with the invention.
Figure 51B:
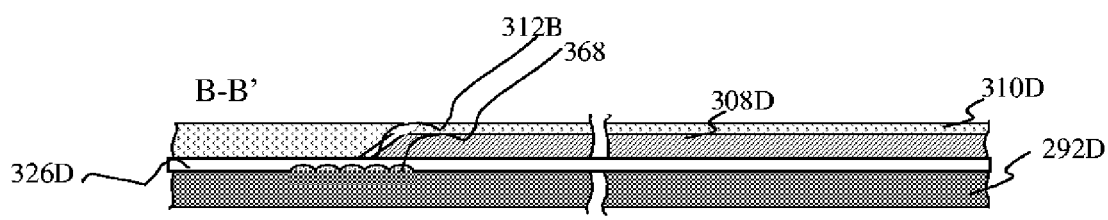
Figure 52A:
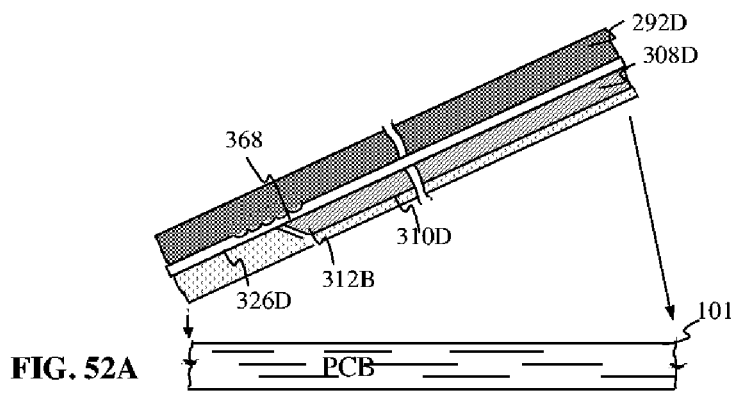
FIGS. 52A and 52B are the enlarged cross-sectional views of waveguide mounting techniques for the waveguides as shown in FIG. 51B, in the preferred embodiment, constructed in accordance with the invention.
Figure 52B:
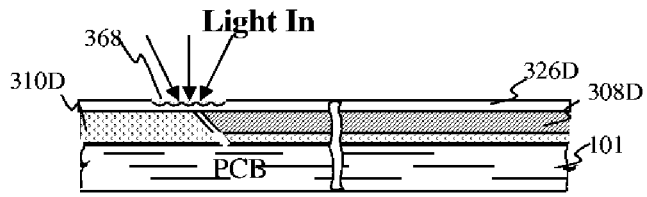

A layer 326D can also be used on the substrate prior to formation of the waveguide layers. FIGS. 47 and 48 show the schematics in the preferred embodiments wherein the same numeral represent the same parts as shown in FIGS. 45 and 46, so that repeated explanation is omitted here. The layer 326D acts as three folds; (a) to prevent the waveguide from the damage while trasnfering to the PCB, (b) after transferring, the layer 326D acts as the upper cladding layer, and (c) also acts as the protecting layer to prevent the waveguide core from post-damaging.

Further grating 366 and the micro-lens 368 can also be formed on the layer 326D to focus the beams onto the mirror. In this case also, the mirror designed in a such a way that after transferred the waveguide to the PCB, the lens or grating can able to focus the beam (to focus to the mirror to transmit through the waveguide core in the case of the receiving beam or to focus to the detector in the case of the transmitted beam). FIGS. 49, 50, 51, and 52 show the schematics in the preferred embodiments wherein the same numerals represent the same parts as shown in FIGS. 45 to 48, so that repeated explanation is omitted here.

Figure 53A:
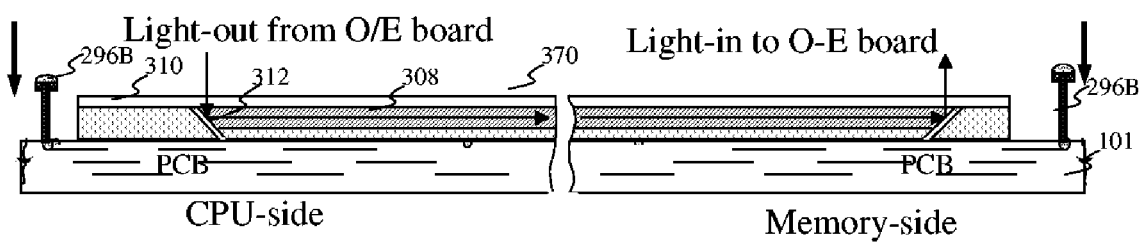
FIGS. 53A and 53B are the enlarged cross-sectional views of waveguide boards, mounted on the PCB in the preferred embodiment, constructed in accordance with the invention.
Figure 53B:
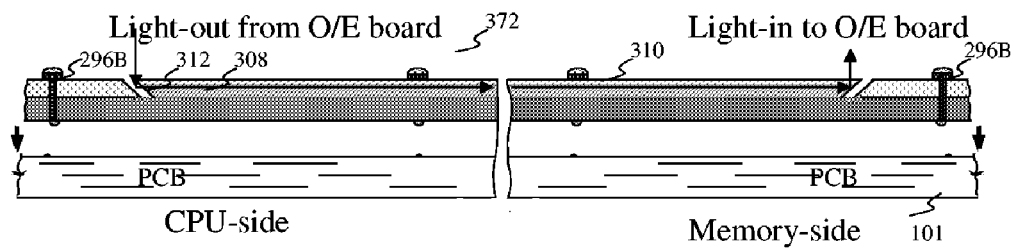

FIGS. 53A and 53B are the schematic showing the waveguide on the PCB in the preferred embodiment wherein the same numerals represent the same parts as shown in FIGS. 45 to 52, so that the repeated explanation is omitted here. The waveguide 370 or 372 are placed on the PCB 101, and the electrical connection for the low speed signals to communicate the chip-package to the PCB are occurred through the electrodes 296B, which is connected to the O-E board.

Figure 54A:
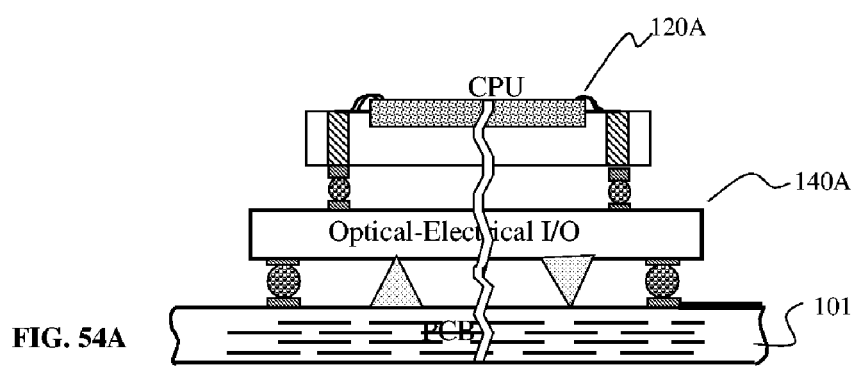
FIGS. 54A, 54B, and 54C are the enlarged cross-sectional views of a packaged chip, O-E board containing the array of optical components, and underlying PCB board, illustrating an interconnect structure for the package for the preferred embodiment in accordance with the present invention.
Figure 54B:
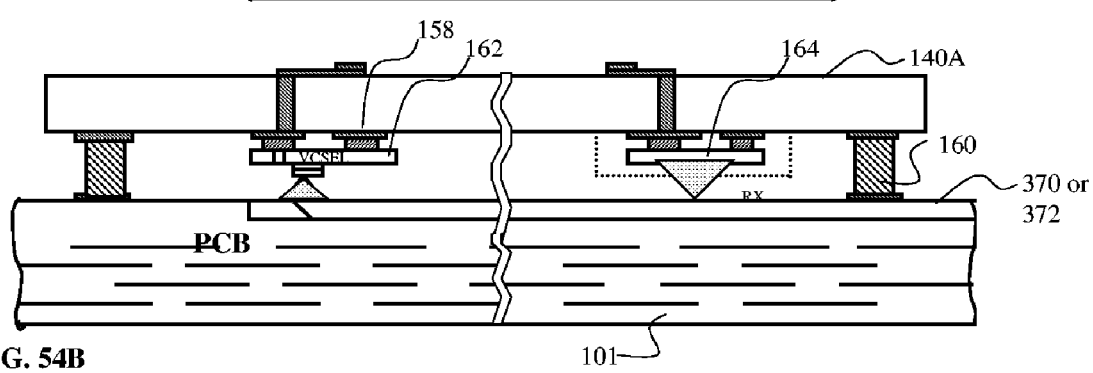
Figure 54C:
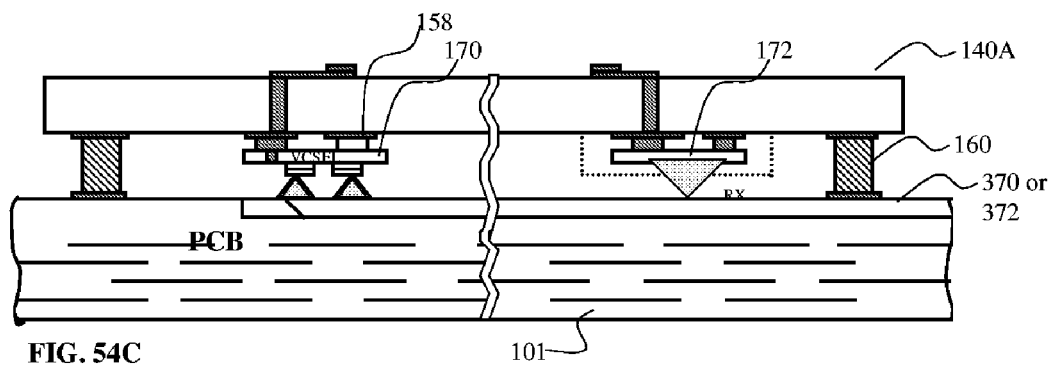

FIGS. 54A, 54B, and 54C are the simplified cross-sectional view of the structure including the chip-package 120A, O-E board 140A, and underlying PCB 101(A) according to the present invention. For simplicity in the explanation, one side of the chip is considered, similar interconnects could be assumed for counterpart chip. Chip package using of BGA or fine BGA is considered. Discrete optical components 162 (and 164), and the array of the optical components 170 (and 172) are considered in the interconnects of FIGS. 54A and 54B, respectively.

Figure 55A:
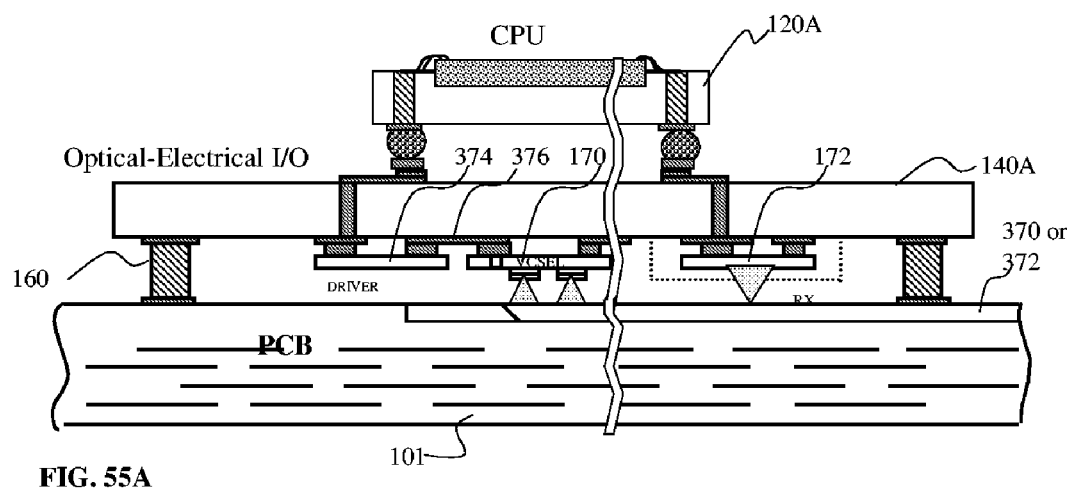

FIGS. 55A and 55B are the simplified cross-sectional view of the structure including the chip-package 120A, O-E board 140A, and underlying PCB 101(A) according to the present invention. For simplicity in the explanation, one side of the chip is considered, similar interconnects could be assumed for counterpart chip. Chip package using of BGA or fine BGA is considered. The array of the optical components 170 (and 172) and the drivers 374 is connected each other through interconnects 376. The driver 374 and the optical components 170 (or 172) can be directly mounted on the O-E substrate (FIG. 55A) or they can be mounted on the common carrier 378 (FIG. 55B) before mounting on the O-E substrate.

Figure 56C:
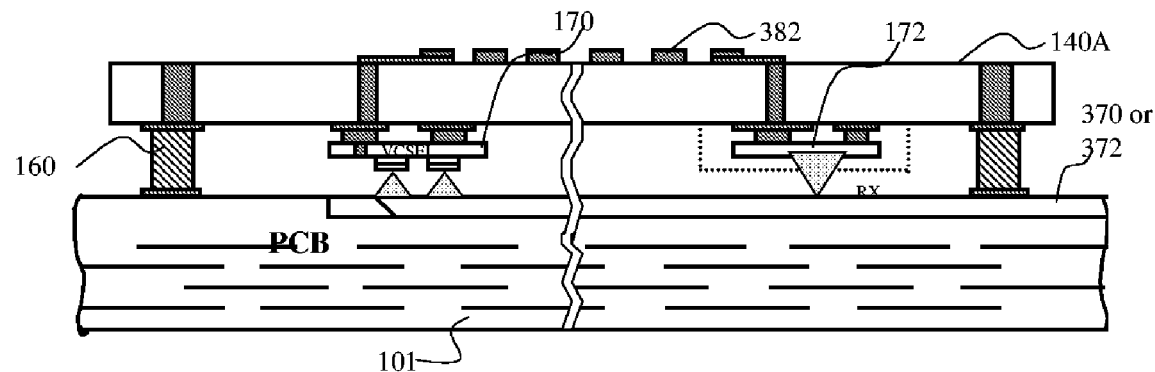

FIGS. 56A, 56B, and 56C are the simplified cross-sectional view of the structure including the CSP based chip-package 120A, O-E board 140A, and underlying PCB 101(A) according to the present invention. For simplicity in the explanation, one side of the chip is considered, similar interconnects could be assumed for counterpart chip. Chip package using of BGA or fine BGA is considered. The packaged chip 120A connect with the O-E board through the interconnects 380 and 382.

Figure 57A:
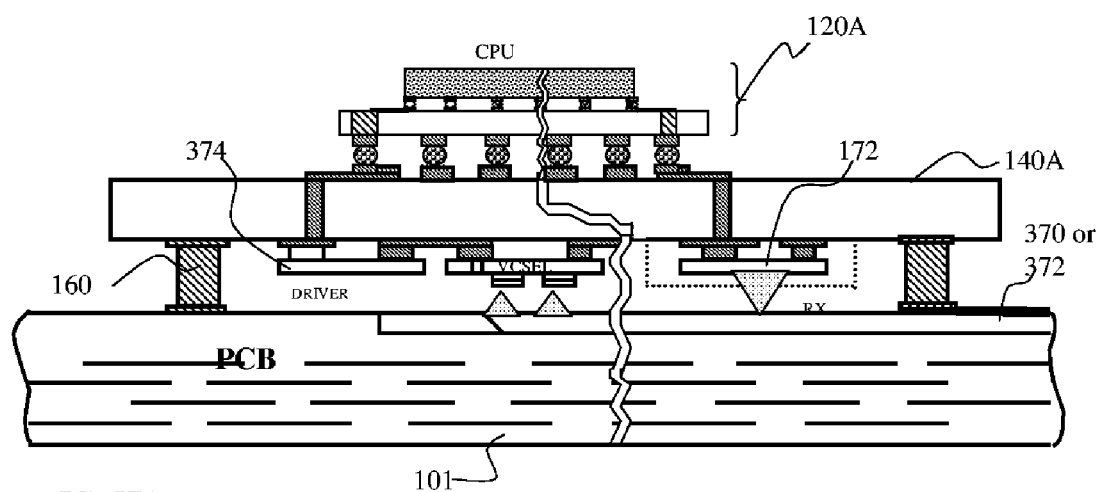
FIGS. 57A and 57B are the enlarged cross-sectional views of a CSP based chip-packaged, an O-E board containing the optical components, and with underlying PCB board, equivalent to FIG. 55 of the alternate embodiment interconnects accordance with the present invention.
Figure 57B:
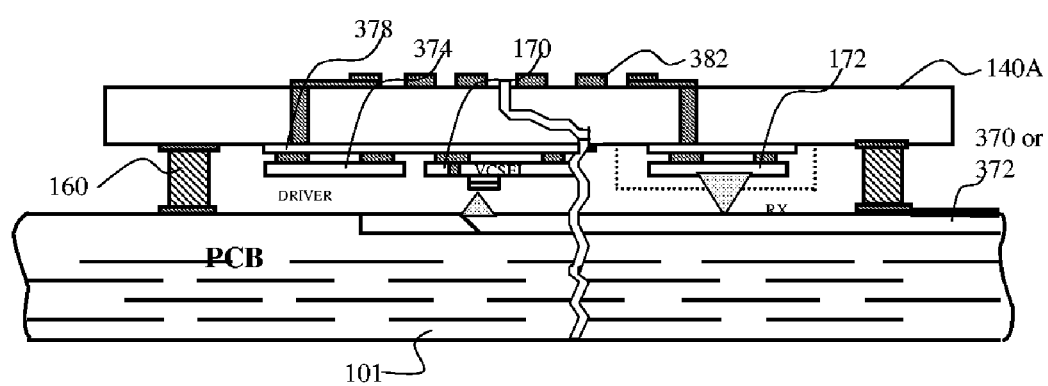

FIGS. 57A and 57B are the simplified cross-sectional view of the structure including the chip-package 120A, O-E board 140A, and underlying PCB 101(A) according to the present invention. For simplicity in the explanation, one side of the chip is considered, similar interconnects could be assumed for counterpart chip. Chip package using of BGA or fine BGA is considered. The array of the optical components 170 (and 172) and the drivers 374 is connected each other through interconnects 376. The driver 374 and the optical components 170 (or 172) can be directly mounted on the O-E substrate (FIG. 57A) or they can be mounted on the common carrier 378 (FIG. 57B) before mounting on the O-E substrate.

In the preferred embodiments, the optical components 170 (or 172) are mounted directly on the O-E substrate or the common carrier 378. In the high speed interconnects, an additional circuit or matching circuit (not shown) may necessary to eliminate the parasitic effect induced due to the interconnects such as chip-packaged and O-E board, and also O-E board to PCB board. Using of this matching circuit, data speed as high as 10Gb/s and beyond can be transmitted from chip packaged to other chip without signal distortion.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

In the preferred embodiments, all contacts of the chip (with package) are transferred to the O-E board so that the electrical contacts for the signal lines are arranged in convenient to bonding of the optical components in single discrete form or in array form and whereas other ground and power lines are arranged to pass throughout the O-E board.

In the preferred embodiments, for simplicity of drawing, the chip-scale package or fine ball grid array type packaging is considered for the electronics chips to be interconnected. The present inventions also cover all kinds of the package available today and also in future. Furthermore, two contacts for each optical component are considered in simplicity of drawings. However, the number of bonding pads on the O-E board for optical components bonding can be varied based on the necessity of the devices and its integration.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

As the low speed signal lines (metal lines) passes from packaged-chip to the PCB, the substantial amount of heat can able to make dissipated through these low speed signal lines, hence no cooler use or cost-effective cooler use is possible.

According to this present invention, z-axis of the electronics-chip to be interconnected with other electronics chip has not been used. So that the z-axis can be used for cooling purpose if necessary.

The present invention is expected to be found practically use in the high-speed off-chip interconnects where the signal speed is 10 Gb/s or beyond. The application includes high-speed multichip module interconnection, 3-D chip or memory interconnection, high speed parallel system for computing, gaming and graphics systems for high speed 2-D or 3-D video transmission, and high bandwidth image display, high speed router where high speed electronics switches (or network processors) are needed to interconnect.

What is claimed is:

1. An optoelectronics chip-to-chip interconnection system comprising:
    at least one packaged chip;
    at least one O-E board located in close physical proximity to the corresponding said packaged chip(s), wherein each said O-E board comprises:
        an E-O means for converting an outbound high-speed electrical signal from said packaged-chip to an outbound high-speed optical signal;
        an O-E means for converting an inbound high-speed optical signal to an inbound high-speed electrical signal for feeding to said packaged chip; and
        a plurality of electrical contacts for a means to transfer electrical signals, other than said high-speed electrical signals, from said packaged chip to an external printed circuit board; and
    a waveguide board located in close physical proximity to said O-E board, wherein said waveguide board comprises:
        at least one waveguide as an optical medium in said waveguide board for transmitting and receiving said high-speed optical signal, wherein each said waveguide has a beam-directing portion located at each end of said waveguide for transmitting and receiving said high-speed optical signal; and
        a plurality of electrical contacts for connection to external components;
    wherein said printed circuit board is either single-layered or multi-layered, with said waveguide board, said O-E board, and said packaged chip located on the top surface of said printed circuit board, and with low-speed electrical paths for electrical connection to external components and wherein said electrical contacts provide heat dissipation from said packaged chip to said printed circuit board.

2. The system according to claim 1, wherein said packaged chip comprises:
    at least one die of electronics with a very-large-scale integrated circuit, and;
    at least one electronic package encapsuling said die(s).

3. The system according to claim 2, wherein said die(s) are made from silicon or III-V based semiconductor materials.

4. The system according to claim 1, wherein said packaged chip is made using chip scale packaging (CSP), and said packaged chip is bonded using fine ball grid array (FBGA) or micro ball grid array (MBGA) techniques.

5. The system according to claim 1, wherein said packaged chip further comprises:
    at least one die of electronics with a very-large-scale integrated circuit; and
    a plurality of electrical contacts for connection to external components.

6. The system according to claim 1, wherein said O-E board has a plurality of electrical connections on each side, wherein said packaged chip corresponding to said O-E board is connected to one side of said O-E board(s) and said printed circuit board is connected to the other side of said O-E board(s).

7. The system according to claim 1, wherein said O-E board further comprises:
    a substrate;
    said plurality of electrical contacts located on both sides of said O-E board; and a set of optical components for converting said outbound high-speed electrical signal from said packaged-chip to said outbound high-speed optical signal for the purpose of transmitting said outbound high-speed optical signal through said waveguide to at least one packaged chip on the opposite side of said waveguide, and for converting said inbound high-speed optical signal signal to said inbound high-speed electrical signal for feeding to said packaged chip.

8. The system according to claim 7, wherein said substrate of said O-E board comprises a non-electrically conductive material.

9. The system according to claim 7, wherein said substrate of said O-E board comprises a rigid or flexible material.

10. The system according to claim 7, wherein each of said optical components may be a surface-emitting type transmitting device or a surface-incidence type receiving device.

11. The system according to claim 10, wherein said surface-emitting type transmitting device is fabricated onto the compound semiconductor substrates, selected from groups of materials under III-V or II-IV periodic tables and include the transmitting means to emit light beams having wavelengths of 600 nm, 650 nm, 780 nm, 850 nm, 980 nm, 1310 nm or 1550 nm.

12. The system according to claim 10, wherein said surface-emitting type transmitting device may be a top-emitting or bottom-emitting type vertical-cavity surface-emitting laser (VCSEL) diode, which is bonded onto said O-E board so as to direct said outbound high-speed optical signal toward said waveguide.

13. The system according to claim 10, wherein the surface-emitting type transmitting device may be an edge-emitter type laser diode bonded on a carrier with a 45 degree mirror to direct said outbound high-speed optical signal in the vertical direction, wherein said edge-emitter with said carrier is bonded onto said O-E board so as to direct said outbound high-speed optical signal to the corresponding said waveguide located onto said printed circuit board.

14. The system according to claim 10, wherein said surface-emitting type transmitting device further comprises a laser diode integrated modulator and a carrier with a 45 degree mirror to direct the modulated said outbound high-speed optical signal in the vertical direction, wherein said laser diode integrated modulator with said carrier is bonded onto said O-E board so as to direct said modulated outbound high-speed optical signal to the corresponding said waveguide located onto said printed circuit board.

15. The system according to claim 10, wherein said surface-incident type receiving device comprises a p-i-n based or metal-semiconductor-metal based photodetector which is bonded onto said O-E board so that said photodetector is facing said inbound high-speed optical signal in order to convert said inbound high-speed optical signal to said inbound high-speed electrical signal.

16. The system according to claim 7, wherein said O-E board further comprises a polymer layer having refractive indices from 1.3 to 3.7 which is transparent to the wavelength of the light beam, so as to minimize loss and to cover the optical components.

17. The system according to claim 16, wherein the material of said polymer layer is electrically non-conductive.

18. The system according to claim 1, wherein said plurality of contacts on said O-E board is located on the top side of said O-E board, and each contact within said plurality of electrical contacts of said O-E board is arranged in such a way that the pitch of said contacts of said O-E board is the same as the pitch of said contacts of said packaged-chip, so as to provide ease in mounting, bonding, or stacking.

19. The system according to claim 7, wherein said optical components are bonded to said substrate using the flip-chip bonding technique with solder bumps.

20. The system according to claim 19, wherein said solder bumps comprise a solder, conductive polymer, or plated metal.

21. The system according to claim 1, wherein said plurality of contacts on said O-E board is located on the bottom side of said O-E board, and said contacts on the bottom side of said O-E board are arranged in such a way that the signal lines corresponding to said outbound high-speed electrical signal and said inbound high-speed electrical signal are located in the same row, and the power and ground lines are arranged in different rows or arranged in peripherals of said O-E board.

22. The system according to claim 21, wherein said signal lines are arranged in one or multiple rows so that optoelectronics devices can be bonded on the O-E board in discrete or an array form.

23. The system according to claim 21, wherein said plurality of contacts on the bottom side of said O-E board are connected to the underlying said printed circuit board with appropriate solder bumps having an appropriate height so as not to touching the optical components to said printed circuit board.

24. The system according to claim 1, wherein said waveguide board further comprises:
   at least one waveguide;
   at least one of said electrical contacts located on both sides of said waveguide board, wherein each electrical contact on one side of said waveguide board connects to at least one contact on the other side of said waveguide board;
   a flex substrate on which said waveguides are formed;
   a 45 degree mirror formed at the end of each said waveguide to redirect the light beam vertically; and
   an optional microlens, discretely or monolithically formed onto said 45 degree mirror.

25. The system according to claim 24, wherein said waveguides further comprise:
   a flex substrate
   a core layer; and
   a clad layer.

26. The system according to claim 1, wherein said waveguide board further comprises;
   at least one optical fiber;
   at least one of said electrical contacts located on both sides of said waveguide board, wherein each electrical contact on one side of said waveguide board connects to at least one contact on the other side of said waveguide board;
   a flex substrate on which said optical fibers are formed;
   a 45 degree mirror formed at the end of each said optical fiber to redirect the light beam vertically; and
   an optional microlens, discretely or monolithically formed onto each said 45 degree mirror.

27. The system according to claim 26, wherein said optical fibers further comprise:
   a flex substrate;
   a core layer; and
   a clad layer.

28. The system according to claim 26, wherein said optical fibers are made using bare fiber, etching, and/or molding with a master mold.

29. The system according to claim 28, wherein said master mold is made by patterning said flex substrate and metal plating, wherein the pattern height of said master mold is equal to the depth of the core layer of said optical fibers.

30. The system according to claim 1, wherein said waveguide board further comprises:
- at least one waveguide;
- a flex substrate on which said waveguides are formed;
- a 45 degree mirror formed at the end of each said waveguide to redirect the light beam vertically; and
- an optional microlens, discretely or monolithically formed onto each said 45 degree mirror.

31. The system according to claim 1, wherein said waveguide board further comprises:
- at least one optical fiber;
- a flex substrate on which said waveguides are formed;
- a 45 degree mirror formed at the end of each said optical fiber to redirect the light beam vertically; and
- an optional focusing means based on microlens or grating, formed discretely or monolithically onto each said 45 degree mirror.

32. The system according to claim 1, wherein said first electrical contacts are used for all low-speed electrical signals in the system and are arranged either in the same manner as any electrical contacts on said packaged chip or peripheral to said second electrical contacts.

33. An optoelectronics chip-to-chip interconnection system comprising:
- an O-E board comprising;
  - a flex circuit board;
  - at least one semiconductor optical component; and
  - a packaged chip located in close physical proximity to said O-E board;
- wherein the packaged structure of said O-E board and said packaged chip comprises:
  - said semiconductor optical component with a device for emitting or receiving light located on the first side of said semiconductor optical component, and a plurality of electrical contacts on the second side of said semiconductor electrical component;
  - a plurality of electrical contacts on the first side of said flex circuit board and a plurality of electrical contacts on the second side of said flex circuit board, wherein said electrical contacts on both said first side and said second side of said flex circuit board are in ball grid array or fine ball grid array, wherein said plurality of electrical contacts on said first side of said flex circuit board are in communication with and arranged in a way compatible to said electrical contacts on said second side of said semiconductor optical component; and
  - a plurality of external electrical contacts on the first side of said packaged chip, wherein said external contacts on said first side of said packaged chip are in electrical communication with and arranged in a way compatible to said external electrical contacts on said second side of said flex circuit board;
  - wherein said semiconductor optical component(s) is bonded onto said first side of said flex circuit board.

34. The system according to claim 33, wherein said semiconductor optical component are bonded using the flip-chip bonding technique with solder bumps.

35. The system according to claim 33, wherein each of said external electrical contacts on said packaged chip is comprised of a solder bump and an electrical pad, wherein said solder bump made from material(s) selected from single of multiple groups, consisting of solder, a conductive polymer, or a plated metal.

36. The system according to claim 33, wherein said semiconductor optical component comprises a semiconductor die having a light receiving or light emitting capability in the vertical direction and a package comprising said semiconductor die and a carrier to redirect an optical signal in the vertical direction.

37. The system according to claim 33, wherein said semiconductor optical component further comprises a passivation layer immersing said semiconductor optical component(s).

38. The system according to claim 37, wherein said semiconductor optical component further comprises at least one lens on top of said passivation layer.

39. The system according to claim 38, wherein said lens comprises the same material as the passivation layer or a different polymer material.

40. The system according to claim 37, wherein said passivation layer comprises a polymer material selected from the groups of materials having a low refractive index and a low adherence to moisture.

41. The system according to claim 33, wherein said contacts comprise bond pads.

42. The system according to claim 33, wherein a separation layer exists between said O-E board and said packaged chip and said separation layer comprises an isotropic or anisotropic conductive material.

43. The system according to claim 42, wherein said anisotropic conductive material comprises a z-axis anisotropic adhesive or polymer material.

44. The system according to claim 33, wherein a separation layer exists between said O-E board and said packaged chip and said separation layer comprises an electrically insulating adhesive layer.

45. An optoelectronics chip-to-chip interconnection packaging system, wherein a packaged structure of a packaged chip and an O-E board comprises:
- said packaged chip with a first plurality of electrical contacts with first bumps or pads formed on each of said first contacts, located on one side of said packaged chip;
- said O-E board comprising:
  - a flex circuit board comprising:
    - a polymer substrate with a second plurality of electrical contacts with second bumps or pads formed on one side of said substrate, opposite of said packaged chip; and
    - a conductor passing through said substrate;
  - wherein said conductor is in electrical communication with said second electrical contacts, and substrate has at least one opening in close physical proximity to said first bumps or pads on said packaged chip, wherein said conductor covers said opening in said substrate;
  - a third plurality of bumps or pads located on said conductor, over said opening and between said conductor and the corresponding said first bump or pad; and
- at least one semiconductor optical component comprising a means for emitting or receiving light located on one side of said semiconductor optical components, opposite of said second electrical contacts;
- wherein said openings are arranged in such a way that when said conductor is bent towards the corresponding said first bump or pad so that it comes into contact with the corresponding said first bump or pad, and therefore creates an electrical connection between said O-E board and said packaged-chip.

46. The packaging system according to claim 45, wherein said first and second bumps or pads comprise a material selected from the class consisting of gold, palladium, or any conductive polymer.

47. The packaging system according to claim 45, wherein said second bumps or pads include a peripheral shoulder for engaging the opening in the conductor.

48. The packaging system according to claim 45, wherein said second plurality of external contacts are ball grid array or fine ball grid array.

49. The packaging system according to claim 45, wherein said first and second bumps or pads comprise metal and are formed using a wire bonding apparatus or a ball bumper apparatus.

50. The optical components as claimed in claim 45 wherein the contacts comprise bond pads.

51. The packaging system according to claim 45, wherein said semiconductor optical components may have a light receiving or light emitting capability in the vertical direction, and the system further comprises a carrier to redirect an optical signal in the vertical direction.

52. The system according to claim 51, further comprising a passivation layer immersing said semiconductor optical components.

53. The system according to claim 52, wherein said passivation layer comprises a polymer material selected from the groups of materials having a low refractive index and a low adherence to moisture.

54. The system according to claim 51, further comprising a lens on the top of said passivation layer.

55. The system according to claim 54, wherein said lens comprises the same material as said passivation layer or any other different polymer material.

56. The system according to claim 45, with a conductive polymer layer between said packaged chip and said substrate, wherein said conductive polymer layer may comprise a z-axis anisotropic adhesive.

* * * * *